(12) United States Patent
Nakamura et al.

(10) Patent No.: US 10,221,949 B2
(45) Date of Patent: Mar. 5, 2019

(54) SEALING MECHANISM, DRIVE UNIT OF SEALING MECHANISM, CONVEYANCE DEVICE, AND MANUFACTURING DEVICE

(71) Applicant: NSK LTD., Tokyo (JP)

(72) Inventors: Tsuyoshi Nakamura, Kanagawa (JP); Hideki Kon, Kanagawa (JP); Hideya Higuchi, Kanagawa (JP)

(73) Assignee: NSK LTD., Tokyo (JP)

( * ) Notice: Subject to any disclaimer, the term of this patent is extended or adjusted under 35 U.S.C. 154(b) by 312 days.

(21) Appl. No.: 15/036,188

(22) PCT Filed: Dec. 10, 2014

(86) PCT No.: PCT/JP2014/082723
§ 371 (c)(1),
(2) Date: May 12, 2016

(87) PCT Pub. No.: WO2015/087925
PCT Pub. Date: Jun. 18, 2015

(65) Prior Publication Data
US 2016/0290510 A1    Oct. 6, 2016

(30) Foreign Application Priority Data

Dec. 10, 2013 (JP) ................................ 2013-255488
Dec. 10, 2013 (JP) ................................ 2013-255489
May 30, 2014 (JP) ................................ 2014-113425

(51) Int. Cl.
*F16J 15/16* (2006.01)
*F16J 15/3284* (2016.01)
(Continued)

(52) U.S. Cl.
CPC ....... *F16J 15/3284* (2013.01); *F16C 33/7886* (2013.01); *F16C 35/06* (2013.01);
(Continued)

(58) Field of Classification Search
CPC ...... F16C 33/7886; F16C 35/06; F16C 19/54; H01L 21/67126; H01L 21/68792; F16J 15/3296; F16J 15/3284; F16J 15/3492
See application file for complete search history.

(56) References Cited

U.S. PATENT DOCUMENTS 3,516,679 A * 6/1970 Wilhelm ................ F16J 15/006
                                                        277/558
6,676,132 B1   1/2004 Takebayashi et al.
(Continued)

FOREIGN PATENT DOCUMENTS

CN        1327150 C    7/2007
EP        1201975 A2   5/2002
(Continued)

OTHER PUBLICATIONS

Communication dated Feb. 4, 2017, issued by the State Intellectual Property Office of the P.R.C. in corresponding Chinese Application No. 201480064689.2.
(Continued)

*Primary Examiner* — Gilbert Y Lee
(74) *Attorney, Agent, or Firm* — Sughrue Mion, PLLC

(57) ABSTRACT

A sealing mechanism functioning as a separator between two spaces having different pressures or gases, includes: a housing; a shaft inserted into the housing; and a plurality of annular sealing members sealing a gap by contacting a part of the shaft or a radial outer surface of a rotary portion fixed to the shaft. The respective annular sealing members include materials having different material quality and are disposed at different positions in an axial direction parallel to a center axis of the shaft.

16 Claims, 10 Drawing Sheets

(51) Int. Cl.
  *F16C 33/78* (2006.01)
  *H01L 21/67* (2006.01)
  *H01L 21/687* (2006.01)
  *F16C 35/06* (2006.01)
  *F16C 19/54* (2006.01)

(52) U.S. Cl.
  CPC .. *H01L 21/67126* (2013.01); *H01L 21/68792* (2013.01); *F16C 19/54* (2013.01)

(56) References Cited

U.S. PATENT DOCUMENTS

| | | | |
|---|---|---|---|
| 7,055,825 B2 | 6/2006 | Watanabe et al. | |
| 7,090,222 B2 | 8/2006 | Watanabe et al. | |
| 8,690,534 B1 * | 4/2014 | Janocko | F16J 15/164 277/508 |
| 2001/0045705 A1 | 11/2001 | Hashimoto | |
| 2003/0178785 A1 | 9/2003 | Egashira et al. | |

FOREIGN PATENT DOCUMENTS

| | | |
|---|---|---|
| JP | 3-125954 U | 12/1991 |
| JP | 2001-99326 A | 4/2001 |
| JP | 2002-228010 A | 8/2002 |
| JP | 2007-9939 A | 1/2007 |
| JP | 2007-146879 A | 6/2007 |
| JP | 2013-204792 A | 10/2013 |

OTHER PUBLICATIONS

Communication dated Oct. 4, 2017, from European Patent Office in counterpart application No. 14868916.9.
Notice of Rejection of Japanese Patent Application No. 2014-113425, dated Apr. 5, 2016.
Notice of Rejection of Japanese Patent Application No. 2013-255488, dated Apr. 12, 2016.
International Search Report of PCT/JP2014/082723, dated Mar. 10, 2015. [PCT/ISA/210].
Written Opinion of PCT/JP2014/082723, dated Mar. 10, 2015. [PCT/ISA/237].

* cited by examiner

SEALING MECHANISM, DRIVE UNIT OF SEALING MECHANISM, CONVEYANCE DEVICE, AND MANUFACTURING DEVICE

CROSS-REFERENCE TO RELATED APPLICATION

This application is a National Stage of International Application No. PCT/JP2014/082723 filed on Dec. 10, 2014 which designates the United States, incorporated herein by reference, and which is based upon and claims the benefit of priority from Japanese Patent Application No. 2013-255488 filed on Dec. 10, 2013, Japanese Patent Application No. 2013-255489 filed on Dec. 10, 2013, and Japanese Patent Application No. 2014-113425 filed on May 30, 2014, the entire contents of which are incorporated herein by reference.

FIELD

The present invention relates to a sealing mechanism functioning as a separator between two spaces having different pressures, a drive unit of the sealing mechanism, a conveyance device, and a manufacturing device.

BACKGROUND

In a conveyance device and a manufacturing device such as a semiconductor manufacturing device or a machine tool, a rotation mechanism to rotate a rotary stage or rotate a semiconductor substrate, a workpiece, or a tool is used. As such a rotation mechanism, for example, a positioning device is disclosed in Patent Literature 1 (refer to FIG. 2).

CITATION LIST

Patent Literature

Patent Literature 1: Japanese Patent Application Laid-open Publication No. 2007-9939

SUMMARY

Technical Problem

According to the technology disclosed in Patent Literature 1, an O-ring that is a contact-type seal is housed inside a seal groove, thereby rotating a shaft while separating an external environment from the inside of a process chamber such as a vacuum chamber. Unfortunately, the O-ring or the shaft may be deformed or abraded because the O-ring is forcedly deformed to contact the shaft although the O-ring improves sealing performance. The O-ring has both merits and demerits depending on material quality thereof, for example, in the case where the material quality is selected suitable for the process chamber, sealing performance may be insufficient, and in the case where the material quality is selected suitable for the external environment, lifetime is shortened due to influence from the inside of the process chamber. Therefore, demanded is a rotation mechanism that improves sealing performance, further suppresses time degradation of a component and reduces frequency of component replacement.

The present invention is achieved in view of the above-described situation and has an objective to provide a sealing mechanism that improves sealing performance, and a drive unit of the sealing mechanism, a conveyance device, and a manufacturing device.

Solution to Problem

To achieve the above objective, a sealing mechanism according to an aspect of the present invention is a sealing mechanism functioning as a separator between two spaces having different pressures or gases and includes: a housing; a shaft inserted into the housing; and a plurality of annular sealing members sealing a gap by contacting a part of the shaft or a radial outer surface of a rotary portion fixed to the shaft. The respective annular sealing members include materials having different material quality and are disposed at different positions in an axial direction parallel to a center axis of the shaft.

According to this sealing mechanism, the plurality of annular sealing members can exert appropriate sealing performance respectively according to different positions in the axial direction of the shaft, and further can suppress progression of degradation of the annular sealing members such as abrasion.

As a desirable embodiment of the present invention, preferably, an annular sealing member positioned closer to a high-pressure side space of the two spaces having different pressures includes material having material quality of high sealing performance, and an annular sealing member positioned closer to a low-pressure side space includes material having material quality of high corrosion resistance. This structure suppresses influence from a vacuum environment, a depressurized environment, and a process-gas-filled environment on the annular sealing member positioned closer to the high-pressure side space, thereby suppressing deterioration of the annular sealing member caused by gas and the like. Since the pressure on the high-pressure side space is reduced by the other annular sealing member, the annular sealing member positioned closer to the low-pressure side space only receives little pressure. Further, the plurality of annular sealing members can exert appropriate sealing performance respectively according to the different positions in the axial direction of the shaft, and progression of deterioration of the annular sealing members such as abrasion can be suppressed.

As a desirable embodiment of the present invention, preferably, the respective annular sealing members includes materials having different hardness, and an annular sealing member positioned closer to the high-pressure side space out of the two spaces having the different pressures includes a material harder than an annular sealing member positioned closer to a low-pressure side space. This suppresses the influence from a vacuum environment, a depressurized environment, and a process-gas-filled environment on the annular sealing member positioned closer to the high-pressure side space, thereby suppressing deterioration of the annular sealing member caused by gas and the like. Since the pressure on the high-pressure side space is reduced by the other annular sealing member, the annular sealing member positioned closer to the low-pressure side space only receives little pressure. By this, the plurality of annular sealing members can exert appropriate sealing performance respectively according to the different positions in the axial direction of the shaft, and progression of deterioration of the annular sealing members such as abrasion can be suppressed.

As a desirable embodiment of the present invention, preferably, the annular sealing member includes a fixing portion contacting the housing, a lip portion contacting the radial outer surface of the rotary portion, and an annular connecting unit connecting the fixing portion to the lip portion. Since this sealing mechanism can increase a contact pressure of the annular sealing member that contacts the rotary portion, high sealing performance can be achieved.

As a desirable embodiment of the present invention, preferably, the sealing mechanism further includes a biasing member that biases pressing force of the lip portion to a rotary portion side, and the biasing member is disposed in a space surrounded by the lip portion, the annular connecting unit, and the fixing portion. With this structure, the sealing mechanism can improve sealing performance.

As a desirable embodiment of the present invention, the shaft is preferably supported in a rotatable manner. By this, the sealing mechanism can transmit rotary movement between the two spaces having the different pressures or gases.

As a desirable embodiment of the present invention, the shaft is preferably supported in a linearly movable manner such that a relative position to the housing is changed in the axial direction. By this, the sealing mechanism can transmit linear movement between the two spaces having the different pressures or gases.

As a desirable embodiment of the present invention, a length between annular sealing members adjacent to each other in the axial direction among the plurality of annular sealing members is preferably longer than a stroke in the axial direction in which the shaft can be linearly moved. With this structure, different lubricants can be used for the annular sealing members adjacent to each other in the axial direction among the plurality of annular sealing members. As a result, lifetime of the annular sealing members can be extended.

As a desirable embodiment of the present invention, preferably, one of annular sealing members adjacent to each other in the axial direction among the plurality of annular sealing members includes a storage portion to supply a lubricant, and a distance from the storage portion to the other annular sealing member of the annular sealing members adjacent to each other in the axial direction is longer than a stroke in the axial direction in which the shaft can be linearly moved. With this structure, different lubricants can be used for the annular sealing members adjacent to each other in the axial direction among the plurality of annular sealing members. As a result, lifetime of the annular sealing members can be extended.

As a desirable embodiment of the present invention, preferably, the sealing mechanism includes a flow passage for exhausting and suctioning operation, and the flow passage is connected to a space between annular sealing members adjacent to each other in the axial direction among the plurality of annular sealing members. With this structure, the sealing mechanism can shorten a warm-up time.

As a desirable embodiment of the present invention, preferably, the sealing mechanism includes a pressure changing device, and the pressure changing device performs exhausting and suctioning operation in the flow passage based on a pressure or a gas flow rate of the flow passage. With this structure, the sealing mechanism can shorten the warm-up time.

As a desirable embodiment of the present invention, preferably, the sealing mechanism includes a pressure changing device, and the pressure changing device constantly performs exhausting operation in the flow passage. With this structure, the sealing mechanism can shorten a warm-up time. Further, with this structure, the sealing mechanism can improve sealing performance.

As a desirable embodiment of the present invention, preferably, a storage portion that supplies a lubricant is provided at a position close to a low-pressure side space in each of the plurality of annular sealing members. With this structure, lifetime of the annular sealing members can be extended.

As a desirable embodiment of the present invention, the sealing mechanism is a rotation mechanism functioning as a separator between two spaces having different pressures, and includes: a housing; a shaft inserted into the housing; a bearing provided at the housing and adapted to support the shaft in a rotatable manner; a rotary portion fixed to one end of the shaft and rotated together with the shaft and further having a radial outer surface facing the housing with a gap having a predetermined size therebetween; and the annular sealing member contacting the radial outer surface of the rotary portion to seal the gap.

In this rotation mechanism, work efficiency of component replacement can be improved by disassembling and removing the rotary portion from the shaft out of the rotation mechanism. After replacement of the rotary portion, the shaft can be put back to the rotation mechanism and used in the rotation mechanism. Therefore, lifetime of the shaft is extended, and cost can be reduced.

As a desirable embodiment of the present invention, preferably, the radial outer surface of the rotary portion is harder than the radial outer surface of the shaft. With this structure, lifetime of the rotary portion can be extended by using a material that can enhance surface hardness for the rotary portion in order to suppress abrasion and at least applying hardening processing to the radial outer surface of the rotary portion. Further, since the rotary portion and the shaft are separate components, freedom of selecting a material for the shaft can be obtained and a range of the hardening processing can be limited. Therefore, manufacturing cost can be reduced. Further, the rotation mechanism can reduce a consumption amount of the material that can enhance the surface hardness in order to suppress abrasion.

As a desirable embodiment of the present invention, preferably, the rotary portion has an outer shape in which an outer periphery of the rotary portion is larger than an outer periphery of the shaft, and a recessed inner wall into which one end of the shaft can be inserted is provided inside the rotary portion. With this structure, a rotational center axis of the rotary portion coincides with a rotational center axis of the shaft. Therefore, adjustment work for the rotational center axes is not needed. Therefore, component replacement at the time of maintenance is facilitated in the rotation mechanism.

As a desirable embodiment of the present invention, preferably, the bearing includes: an outer ring; an inner ring disposed on a radially inner side of the outer ring; and a rolling element disposed between the outer ring and the inner ring, and one end of the rotary portion is inserted into a space surrounded by the inner ring to be engaged with the inner ring. With this structure, the rotational center axis of the rotary portion coincides with the rotational center axis of the shaft. Therefore, adjustment work for the rotational center axes is not needed. Therefore, component replacement at the time of maintenance is facilitated in the rotation mechanism.

As a desirable embodiment of the present invention, preferably, the bearing includes: an outer ring; an inner ring disposed on a radially inner side of the outer ring; and a rolling element disposed between the outer ring and the inner ring, and the rotary portion is an inner ring holding member to fix the inner ring. With this structure, positioning for the bearing can be performed by temporarily fixing the rotary portion to the shaft as the inner ring holding member. Therefore, work efficiency is improved and assembling work or disassembling work for the rotation mechanism is facilitated. Further, the number of components is reduced in the rotation mechanism, and a low-cost rotation mechanism can be provided.

As a desirable embodiment of the present invention, preferably, the rotary portion has an outer shape in which the outer periphery of the rotary portion is larger than the shaft, and at least a part of the one end of the rotary portion is made to abuts on the inner ring. With this structure, the number of components is reduced, and the low-cost rotation mechanism can be provided.

As a desirable embodiment of the present invention, preferably, the annular sealing member includes: a fixing portion contacting the housing; a lip portion contacting the radial outer surface of the rotary portion; and an annular connecting unit to connect the fixing portion to the lip portion. Since this rotation mechanism can increase contact pressure of the annular sealing member that contacts the rotary portion, high sealing performance can be achieved.

As a desirable embodiment of the present invention, preferably, a biasing member to bias pressing force of the lip portion to the rotary portion side is further provided, and the biasing member is disposed in a space surrounded by the lip portion, the annular connecting unit, and the fixing portion. With this structure, the rotation mechanism can improve sealing performance.

As a desirable embodiment of the present invention, preferably, the plurality of the annular sealing members is provided, and the respective annular sealing members are disposed at different positions in the axial direction parallel to the rotational center axis of the shaft, and contact the radial outer surface of the rotary portion. With this structure, the rotation mechanism can improve sealing performance.

A desirable embodiment of the present invention is preferably a rotary drive unit including the above-described rotation mechanism and an electric motor to drive the shaft. With this structure, high sealing performance can be achieved in the rotary drive unit.

A desirable embodiment of the present invention is preferably a drive unit of the sealing mechanism including: the above-described sealing mechanism; and a drive unit applying at least one of rotary movement or linear movement to the shaft. With this structure, high sealing performance can be achieved in the drive unit of the sealing mechanism.

A desirable embodiment of the present invention is preferably a conveyance device including the above-described sealing mechanism and a movable member moving a conveyance object, and movement of the movable member is linked with at least one of rotary movement and linear movement of the shaft. With this structure, high sealing performance can be achieved in the conveyance device.

A desirable embodiment of the present invention is preferably a manufacturing device including the above-described sealing mechanism. With this structure, high sealing performance can be achieved in the manufacturing device, and product quality can be improved.

A desirable embodiment of the present invention is preferably an assembling method of a rotation mechanism, in which the following are performed: the rotation mechanism is disassembled; the rotary portion is removed from the shaft; a new rotary portion is fixed to the shaft; and the rotation mechanism is assembled. According to this method, the shaft can have long lifetime, and work efficiency of component replacement can be improved.

Advantageous Effects of Invention

According to the present invention, it is possible to provide a sealing mechanism that improves sealing performance, a drive unit of the sealing mechanism, a conveyance device, and a manufacturing device.

DESCRIPTION OF EMBODIMENTS

In the following, modes to implement the present invention (hereinafter referred to as embodiments) will be described with reference to the drawings. Note that the present invention is not limited to the embodiments recited in the following. Further, components in the following embodiments include those readily conceivable by a man skilled in the art, those substantially identical therewith, and those within a so-called equivalent range. Moreover, the components disclosed in the following embodiments can be suitably combined.

First Embodiment

Figure 1:
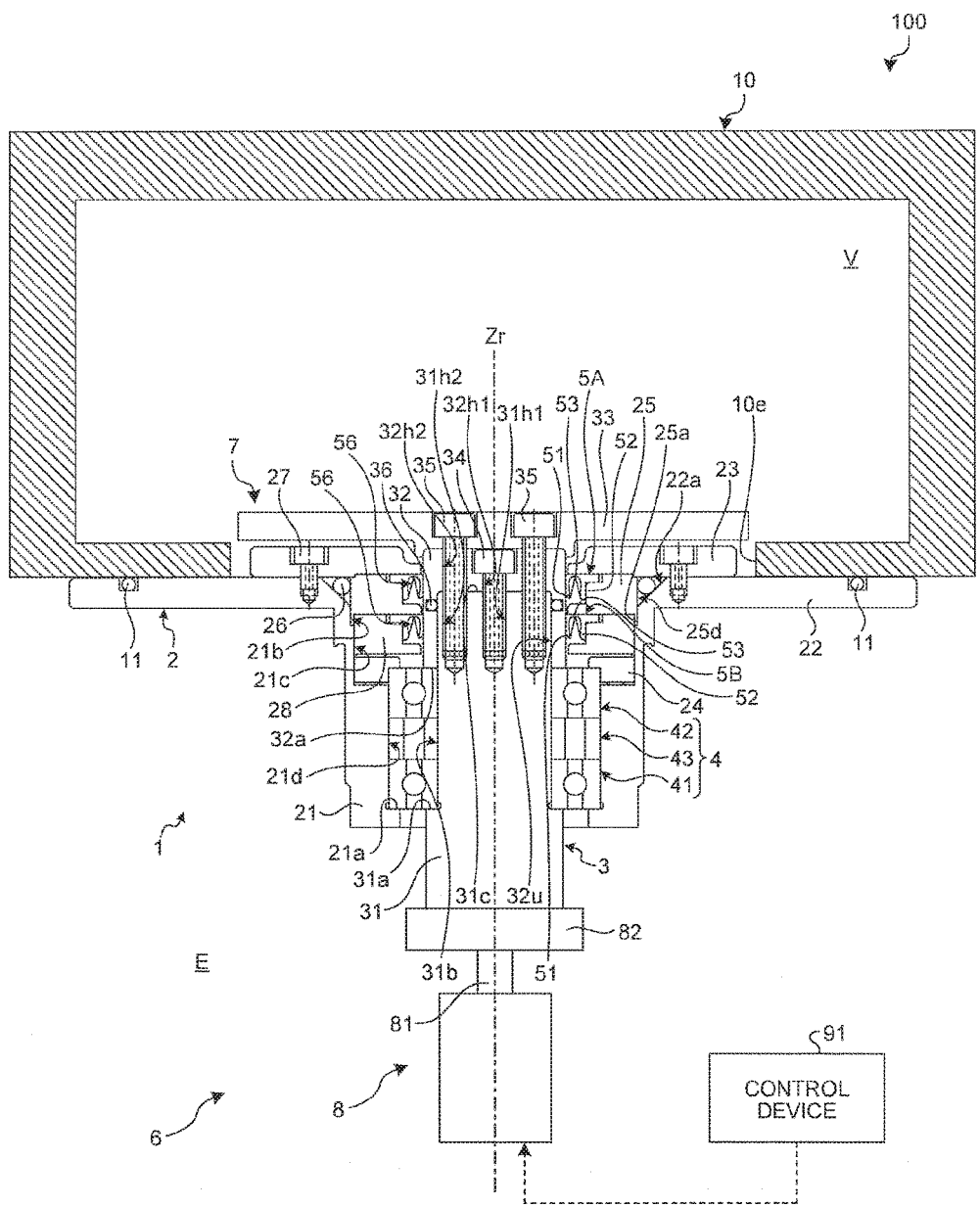
FIG. 1 is a cross-sectional view schematically illustrating a manufacturing device including a rotation mechanism according to a first embodiment.
Figure 2:
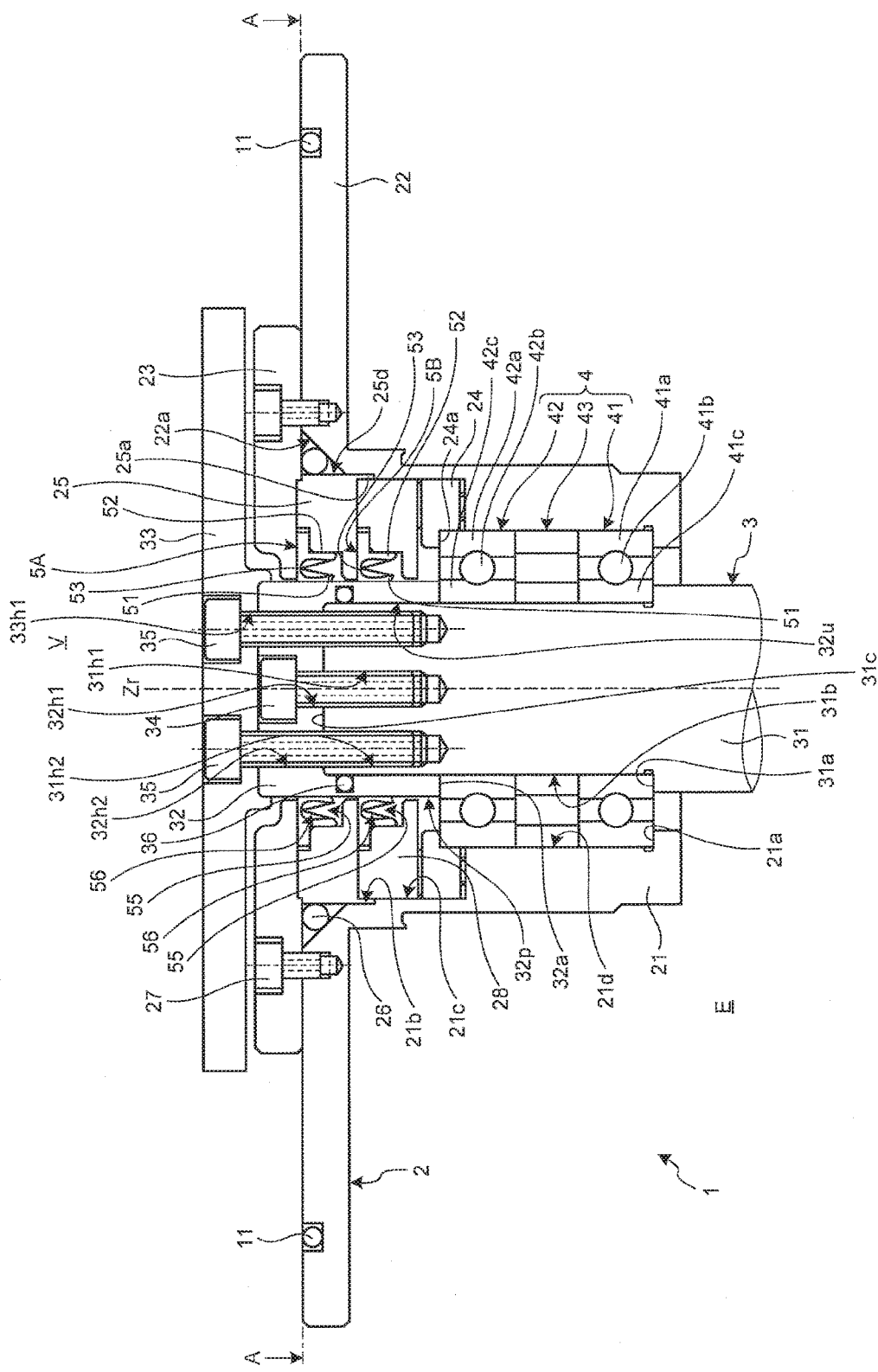
FIG. 2 is a cross-sectional view schematically illustrating the rotation mechanism according to the first embodiment.
Figure 3:
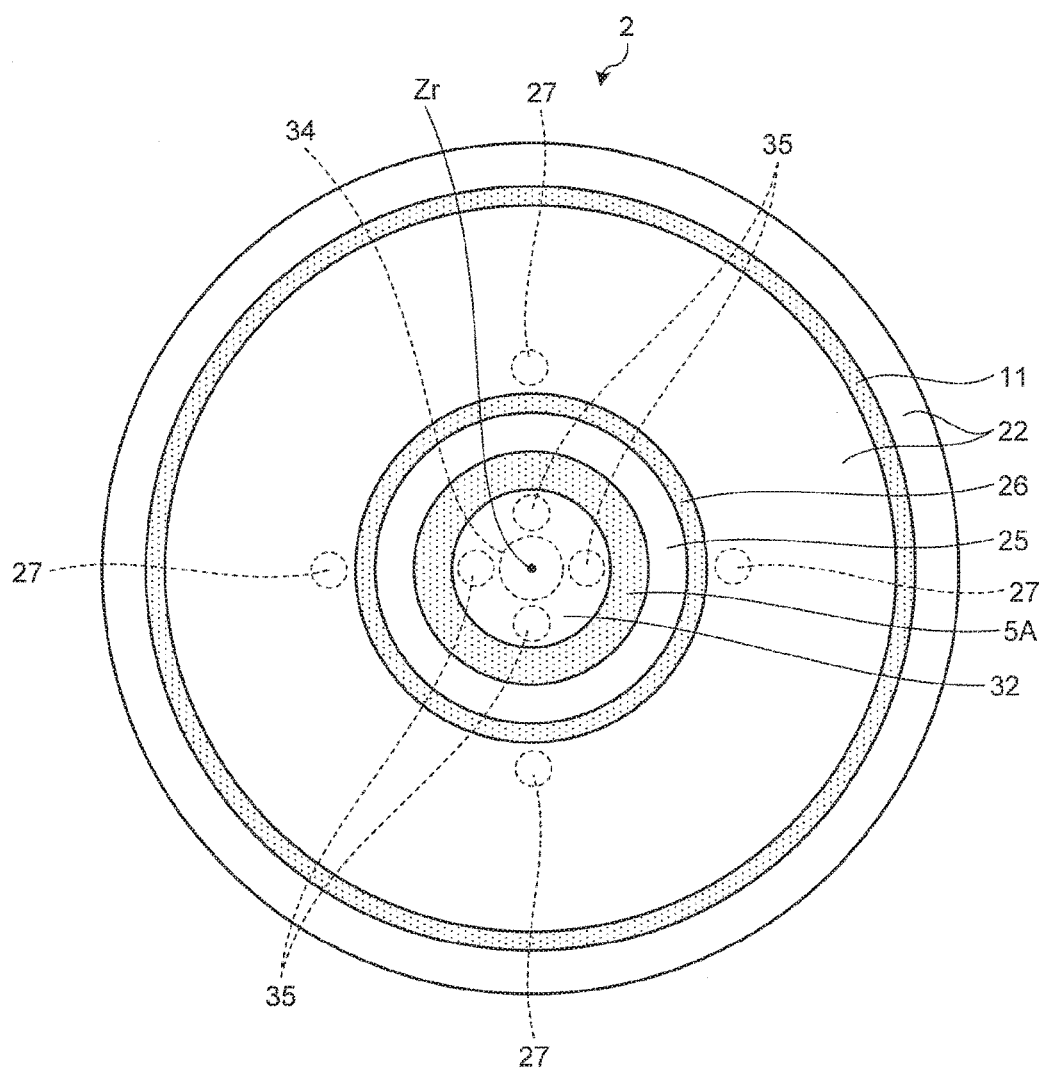
FIG. 3 is a view on arrow A-A of FIG. 2.
Figure 4:
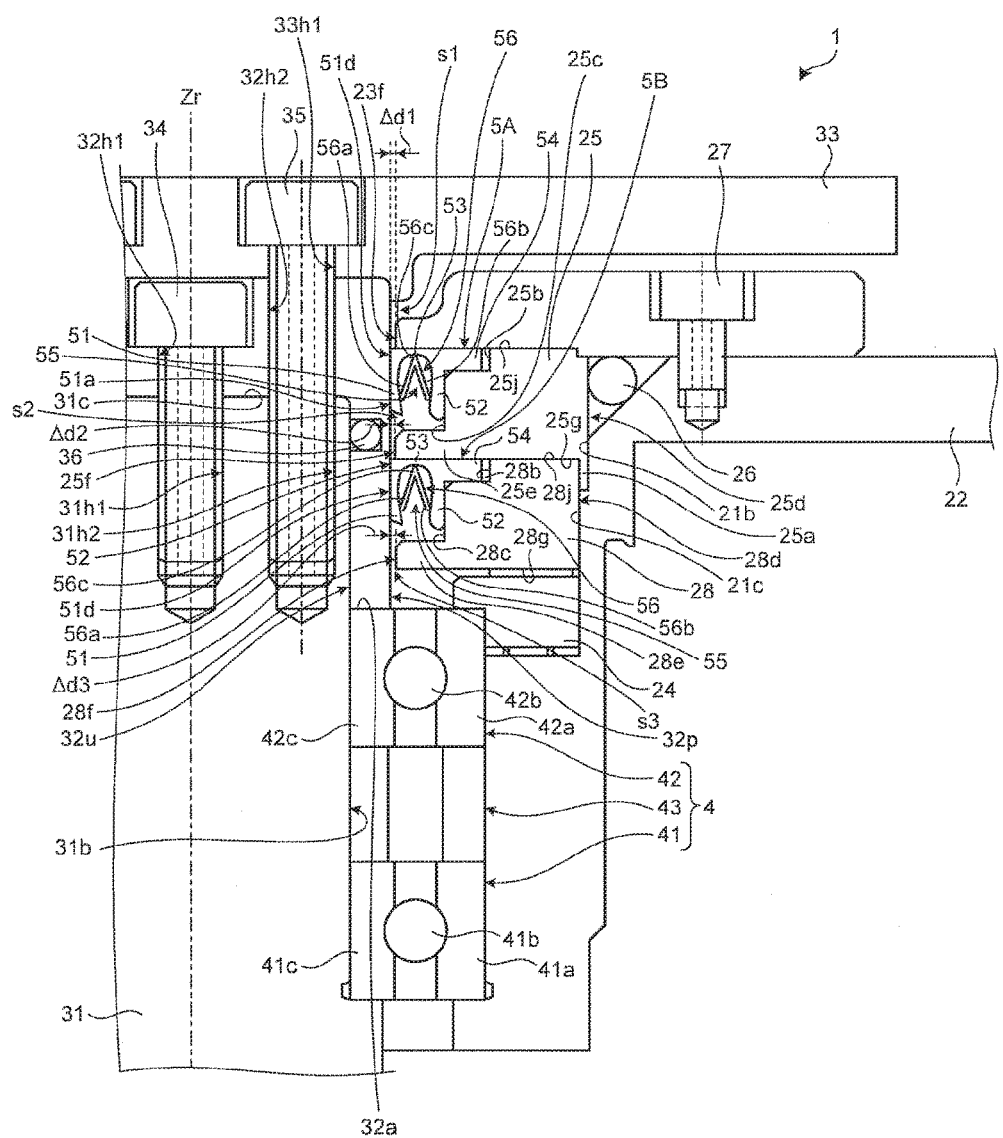
FIG. 4 is an enlarged view illustrating a gap in the rotation mechanism according to the first embodiment.

FIG. 1 is a cross-sectional view schematically illustrating a manufacturing device including a rotation mechanism according to a first embodiment. FIG. 2 is a cross-sectional view schematically illustrating the rotation mechanism according to the first embodiment. FIGS. 1 and 2 are the cross-section surfaces illustrating the rotation mechanism 1 taken along a plane including a rotational center axis Zr of the rotation mechanism 1 and parallel to the rotational center axis Zr. Note that an axial direction in the first embodiment is a direction parallel to the rotational center axis Zr. FIG. 3 is a view on arrow A-A of FIG. 2. FIG. 4 is an enlarged view illustrating a gap in the rotation mechanism according to the first embodiment. The rotation mechanism 1 is a mechanical element that transmits rotation and is used in a special environment such as a vacuum environment, a depressurized environment, and a process-gas-filled environment. The rotation mechanism 1 is applied to a manufacturing device, a conveyance device, and a drive unit for semiconductor manufacturing, machine tool manufacturing, or the like. Here, a description will be given for a case where the rotation mechanism 1 is a rotary drive unit (spindle unit) including a spindle as a rotary shaft in a manufacturing device of semiconductor manufacturing, but an object to which the rotation mechanism 1 is applied is not limited thereto.

As illustrated in FIG. 1, for example, a manufacturing device 100 used for semiconductor manufacturing includes the rotation mechanism 1, a frame body 10, an electric motor 8, and a control device 91 to control the electric motor 8. The rotation mechanism 1 and the electric motor 8 function as a drive unit 6 of a sealing mechanism and transmit rotation of the electric motor 8, and rotate a conveyance table (movable member) 33. After the internal space V of the frame body 10 is set to a vacuum environment, a depressurized environment, or a process-gas-filled environment, a conveyance device 7 in the manufacturing device 100 loads a conveyance object (such as a semiconductor substrate, a workpiece, or a tool) existing in an internal space V on the conveyance table (movable member) 33 to move the conveyance object. In the case of moving the conveyance object, a foreign matter may be generated by operation of the electric motor 8 when the electric motor 8 is installed in the internal space V. Therefore, in the manufacturing device 100, the electric motor 8 is installed in an external space E while keeping the conveyance table 33 inside the internal space V. Further, the rotation mechanism 1 is a sealing mechanism that transmits power of the electric motor 8 installed in the external space E to the internal space V while separating the internal space V from the external space E and improving sealing performance. The electric motor 8 is, for example, a direct drive motor, a drive unit using a belt drive, a linear motor, a servo motor, and so on. The control device 91 includes an input circuit, a central processing unit (CPU) that is a central calculation processing unit, a memory that is a storage unit, and an output circuit. The manufacturing device 100 can manufacture a desired product by: controlling the electric motor 8 in accordance with a program stored in the memory; loading the conveyance object (such as a semiconductor substrate, a workpiece, or a tool) existing in the internal space V on the conveyance table (movable member) 33; and moving the same. The conveyance device 7 includes the conveyance table (movable table) 33 to move the conveyance object and moves the conveyance object by linking rotary movement of a shaft of the rotation mechanism 1 with movement of the conveyance table (movable member) 33.

The rotation mechanism 1 includes a housing 2, a rotary member 3, and a bearing 4. The housing 2 is a member to house the bearing 4. In the first embodiment, the housing 2 includes, as a housing body, a barrel portion 21 that is a cylindrical member, and a housing flange portion 22 provided at one end portion of the barrel portion 21. Additionally, the housing 2 further includes a lid portion 23, an outer ring stopper member 24, and a seal fixing spacer 25. The lid portion 23 is fixed to the housing flange portion 22 with a bolt 27. The outer ring stopper member 24 and the seal fixing spacer 25 are disposed inside the barrel portion 21 of the housing body. In the first embodiment, the barrel portion 21 is a tube-shaped member (for example, cylinder shape) and includes through-holes 21d, 21c, 21b directed from one end portion to the other end portion of the barrel portion 21.

The housing flange portion 22 is a plate-like flange member in all cases. In the first embodiment, a shape of the housing flange portion 22 is a circle shape in a planar view, but the shape is not limited thereto. The housing flange portion 22 includes the mentioned through-hole 21b that includes the rotational center axis Zr of a shaft 31 and penetrates in a thickness direction of the shaft 31. In the housing 2, the housing flange portion 22 is disposed so as to cover an opening portion 10e of the frame body 10 from the outside of the frame body 10, and fixed to the frame body 10 by fastening the housing flange portion 22 and a wall surface of the frame body 10 with a bolt (not illustrated). This enables the housing 2 to block the opening portion 10e of the frame body 10 from the outside of the frame body 10. The housing flange portion 22 includes an annular groove at a portion overlapping with the frame body 10 in a planar view, and an O-ring (annular seal) 11 is fitted into the annular groove to improve sealing performance between the housing flange portion 22 and the frame body 10.

The rotary member 3 includes the shaft 31, a rotary portion (outer peripheral portion) 32, and the conveyance table (movable member) 33. The shaft 31 is an output shaft (main shaft) of the rotation mechanism 1 and has one end portion inserted into the housing 2. The shaft 31 has the other portion connected to an output shaft 81 of the electric motor 8 via a coupling 82. The conveyance table (movable member) 33 is fixed to the one end portion of the shaft 31 via the rotary portion 32.

The conveyance table 33 and the rotary portion 32 are rotated together with the shaft 31. An object is placed on a surface of the conveyance table 33 opposite a surface on the one end portion side of the shaft 31. In the first embodiment, the conveyance table 33 is a plate-like member, and has a circle shape in a planar view. The conveyance table 33 extends to the radial outside of the rotary portion 32 that projects more in the axial direction than the housing flange portion 22 of the housing 2.

In the first embodiment, the bearing 4 is disposed inside the housing 2 and supports the shaft 31 in a rotatable manner. The bearing 4 includes a bearing 41 and a bearing 42 disposed apart from each other along the rotational center axis Zr via a bearing spacer 43 formed like a duplex cylinder. This enables the bearing 4 to suppress whirling vibration of the shaft 31 by supporting the shaft 31 at a plurality of points, namely, the bearing 41 and the bearing 42. In the first embodiment, the shaft 31 is supported at the housing 2 by the two bearings 41, 42, but the number of bearings is not limited to two.

As illustrated in FIG. 2, the bearings 41, 42 include outer rings 41a, 42a, rolling elements 41b, 42b, and inner rings 41c, 42c, respectively. The inner rings 41c, 42c are disposed on a radially inner side of the outer rings 41a, 42a, respectively. Thus, in the first embodiment, both of the bearing 41, 42 are rolling bearings. The rolling elements 41b, 42b are disposed between the outer rings 41a, 42a and the inner rings 41c, 42c, respectively. The outer rings 41a, 42a of the bearings 41, 42 contact an inner wall of the through-hole 21d included in the barrel portion 21 of the housing 2.

As illustrated in FIG. 2, an axial one end of the outer ring 41a contacts a positioning portion 21a formed by carving the inner wall of the through-hole 21d included in the barrel portion 21. An outer ring presser 24a of the outer ring stopper member 24 positions and fixes an axial one end of the outer ring 42a. Therefore, the positioning portion 21a and the outer ring stopper member 24 sandwich the bearing 41, bearing spacer 43, and bearing 42 in the axial direction and fix these components. With this structure, the bearings 41, 42 are mounted on the housing 2. In the first embodiment, both of the bearings 41, 42 are ball bearings, but the type of the bearings 41, 42 as the rolling bearings are not limited to the ball bearings. Further, in the first embodiment, both of the bearings 41, 42 are the rolling bearings, but may also be slide bearings.

The rotary portion 32 has a cylindrical shape including a hollow recessed portion, and a radial outer surface of the rotary portion 32 faces the housing 2 with a gap 55 having a predetermined size therebetween. The rotary portion 32 of the first embodiment is coaxial with the shaft 31, but the rotary portion 32 has a diameter larger than the diameter of the shaft 31. Thus, in the rotary portion 32, a radial outer surface 32$p$ of the rotary portion 32 has an outer shape larger than an outer periphery 31$b$ of the shaft 31, and a recessed inner wall 32$u$ whereby one end 31$c$ of the shaft 31 can be inserted into the hollow portion inside the rotary portion 32 is provided. Thus, the rotary portion 32 has a covering structure that covers the one end 31$c$ of the shaft 31. Since the one end 31$c$ of the shaft 31 is inserted into the rotary portion 32, the rotational center axis of the rotary portion 32 coincides with the rotational center axis Zr of the shaft 31. Therefore, adjustment work for the rotational center axes is not needed. Therefore, component replacement at the time of maintenance is facilitated in the rotation mechanism 1 according to the first embodiment.

As illustrated in FIG. 2, the rotary portion 32 includes a through-hole 32$h$1 and a through-hole 32$h$2 penetrating in the axial direction from the conveyance table (movable member) 33 side serving as one end portion toward the shaft 31 side serving as the other end portion. The through-hole 32$h$1 is opened in a manner coaxial with the rotational center axis Zr of the rotary portion 32. The through-hole 32$h$2 is opened at a plurality of positions that are point-symmetric relative to the rotational center axis Zr of the rotary portion 32. Here, the above-described conveyance table (movable member) 33 includes a through-hole 33$h$1 that penetrates in the axial direction from the one end portion to the other end portion. The through-hole 33$h$1 is opened at a plurality of positions that are point-symmetric relative to the rotational center axis Zr of the conveyance table (movable member) 33. On the other hand, a screw hole 31$h$1 and a screw hole 31$h$2 are opened at a side surface of the one end 31$c$ of the shaft 31. The screw hole 31$h$1 is opened in a manner coaxial with the rotational center axis Zr of the shaft 31. The screw hole 31$h$2 is opened at a plurality of positions that are point-symmetric relative to the rotational center axis Zr of the shaft 31.

A bolt 34 passes through the through-hole 32$h$1 in a state that the one end 31$c$ of the shaft 31 is inserted into the hollow portion inside the rotary portion 32, and is fastened with the screw hole 31$h$1 to fix the rotary portion 32 and the shaft 31. Further, a plurality of bolts 35 passes through the through-hole 33$h$1 and the through-hole 32$h$2 in a state that the rotary portion 32 and the shaft 31 are fixed with the bolt 34, and is fastened with the screw hole 31$h$2 to fix the rotary portion 32 and the shaft 31. Note that the bolt 34 may be fastened to the through-hole 32$h$2 by using at least one of the inside of the through-hole 32$h$2 as a female screw.

As described above, the rotary portion 32 of the first embodiment is coaxial with the shaft 31, but the rotary portion 32 has the diameter larger than the diameter of the shaft 31. Therefore, in the rotary portion 32, at least a part of a side surface 32$a$ on the opposite side of the conveyance table 33 is made to abut on the inner ring 42$c$ and function as an inner ring presser. With this structure, the number of components is reduced, and the low-cost rotation mechanism 1 can be provided. An axial one end of the inner ring 41$c$ contacts a positioning portion 31$a$ at an outer peripheral recessed portion included in the shaft 31. Since the rotary portion 32 positions and fixes an axial one end of the inner ring 42$c$, the positioning portion 31$a$ and the rotary portion 32 sandwich the bearing 41, bearing spacer 43, and the bearing 42 in the axial direction and fix these components. With this structure, the bearings 41, 42 are mounted on the shaft 31. Meanwhile the rotary portion 32 can apply appropriate pressing force in the axial direction of the inner ring 42$c$ by fixing when the rotary portion 32 and the shaft 31 with the bolt 34.

The inner wall 32$u$ of the hollow portion of the rotary portion 32 is provided with an O-ring (second annular sealing member) 36 fitted into an annular groove annularly recessed from a flat surface parallel to the axial direction. The O-ring (second annular sealing member) 36 suppresses gas leakage via the through-hole 32$h$1, and can improve sealing performance of the rotation mechanism 1.

The seal fixing spacer 25 determines a size of the gap 55 and further fixes an annular sealing member 5A. As illustrated in FIG. 3, the seal fixing spacer 25 is an annular member. As illustrated in FIG. 4, the seal fixing spacer 25 includes: a spacer positioning portion 25$a$ having an axially-extending portion on a radial outer peripheral side thereof; a seal fixing recessed portion 25$b$; a radial inner peripheral portion 25$c$; a radial outer peripheral portion 25$d$; an annular projecting portion 25$e$ projecting more than the radial inner peripheral portion 25$c$ to the rotary portion 32 side; one axial end 25$j$; and the other axial end 25$g$. At least a part of the radial outer peripheral portion 25$d$ contacts an inner wall of the through-hole 21$b$ of the barrel portion 21. Since the seal fixing spacer 25 functions as a guide of the annular sealing member 5A, an appropriate setting value can be set for a contact pressure of the annular sealing member 5A that contacts the rotary portion 32.

Further, in the housing flange portion 22, an annular groove 22$a$ is formed concentrically with the rotational center axis Zr, and at least a part of the radial outer peripheral portion 25$d$ forms a part of a wall surface of the annular groove 22$a$. When the lid portion 23 is fixed to the housing flange portion 22 with the bolt 27, an O-ring (third annular sealing member) 26 fitted into the annular groove 22$a$ functions as a seal with improved sealing performance. Further, the lid portion 23 abuts on the axial one end 25$j$ of the seal fixing spacer 25. Then, the O-ring (third annular sealing member) 26 is disposed at a position where a diameter thereof is larger than that of the annular sealing member 5A. Further, the spacer positioning portion 25$a$ is sandwiched and fixed between the seal fixing spacer 28 and the inner wall of the through-hole 21$b$ of the barrel portion 21 described above. The annular groove 22$a$ and the O-ring (third annular sealing member) 26 are not needed in the case where a vacuum level of the internal space V is low.

As illustrated in FIG. 3, the annular sealing member 5A is disposed so as to draw a concentric circle around the rotational center axis Zr in the same manner as the rotary portion 32, seal fixing spacer 25, O-ring (third annular sealing member) 26 fixed to the housing flange portion 22, and O-ring 11. An annular sealing member 5B is disposed in the same manner as the annular sealing member 5A. Further, as illustrated in FIG. 2, the annular sealing members 5A, 5B are disposed closer than the bearing 4 to the internal space V that is a low-pressure side space of the two spaces having different pressures. With this structure, the annular sealing members 5A, 5B prevent a lubricant and the like used in the bearing 4 from spattering on the internal space V side.

A seal fixing spacer 28 determines the size of the gap 55 and further fixes the annular sealing member 5B. Same as the seal fixing spacer 25 illustrated in FIG. 3, the seal fixing spacer 28 is an annular member. As illustrated in FIG. 4, the seal fixing spacer 28 includes a seal fixing recessed portion 28$b$, a radial inner peripheral portion 28$c$, a radial outer peripheral portion 28$d$, an annular projecting portion 28$e$ projecting more than the radial inner peripheral portion 28$c$ to the rotary portion 32 side, one axial end 28$j$, and the other axial end 28$g$. At least a part of the radial outer peripheral portion 28$d$ contacts an inner wall of the through-hole 21$c$ of the barrel portion 21. Since the seal fixing spacer 28 functions as a guide of the annular sealing member 5B, an appropriate setting value can be set for a contact pressure of the annular sealing member 5B that contacts the rotary portion 32. The one axial end 28$j$ is a side surface facing the other axial end 25$g$ of the seal fixing spacer 25, and the other axial end 28$g$ is a side surface facing the outer ring stopper member 24. The seal fixing spacer 28 is fixed by being sandwiched between the seal fixing spacer 25 and the outer ring stopper member 24.

As illustrated in FIG. 4, the annular sealing members 5A, 5B respectively include: fixing portions 52 that contact the radial inner peripheral portions 25$c$, 28$c$ of the seal fixing spacers 25, 28 of the housing 2; lip portions 51 that contact the radial outer surface 32$p$ of the rotary portion 32; annular connecting units 53 that connect the fixing portion 52 to the lip portion 51; and seal flange portions 54. With this structure, the fixing portion 52, annular connecting unit 53, and lip portion 51 form a U-shape in a cross-section, and a space surrounded by the fixing portion 52, annular connecting unit 53, and lip portion 51 are opened toward the external space E that is a high-pressure side space of the two spaces having the different pressures.

Material quality of the annular sealing members 5A, 5B is, preferably, polyethylene or polytetrafluoroethylene. As the material quality of the annular sealing members 5A, 5B, polyethylene or polytetrafluoroethylene has excellent resistance to abrasion and resistance to chemicals, and is suitable for lubrication with the rotary portion 32.

Material quality of the rotary portion 32 to be contacted is, preferably, any one of high carbon chromium bearing steel material, martensitic stainless steel, precipitation hardening stainless steel, and high silicon alloy of precipitation hardening stainless containing 3.4 mass % or more of Si. With this structure, abrasion of the annular sealing members 5A, 5B is suppressed, and the rotation mechanism 1 according to the first embodiment can improve sealing performance.

Hardening processing is applied by using a material that can enhance surface hardness for the material quality of the rotary portion 32 to be contacted such that Rockwell hardness of the radial outer surface 32$p$ of the rotary portion 32 becomes 50 HRC or more. The hardening processing is applied by coating the radial outer surface 32$p$ of the rotary portion 32 with diamond like carbon (DLC). Alternatively, the hardening processing is applied by coating the radial outer surface 32$p$ of the rotary portion 32 with hard chrome plating. This can extend lifetime of the rotary portion 32. For example, in the case where the Rockwell hardness of the shaft 31 is about 50 HRC, the Rockwell hardness of the radial outer surface 32$p$ of the rotary portion 32 can be made higher than 50 HRC. Therefore, the radial outer surface 32$p$ of the rotary portion 32 can be hardened more than the radial outer surface of the shaft 31. The rotation mechanism 1 can reduce a consumption amount of the material that can enhance the surface hardness in order to suppress abrasion by using a different material for the shaft 31. Further, the radial outer surface 32$p$ of the rotary portion 32 can be made harder than the radial outer surface of the shaft 31. Since the rotary portion 32 and the shaft 31 are separate components, freedom of selecting the material for the shaft 31 can be obtained and a range of the hardening processing can be limited. Therefore, manufacturing cost of the rotation mechanism 1 can be reduced.

The annular sealing members 5A, 5B are not limited to two, and three or more annular sealing members may be provided as well. The plurality of annular sealing members 5A, 5B can improve sealing performance of the rotation mechanism 1. By using different material quality for the annular sealing member 5A, 5B respectively, both corrosion resistance and durability can be secured.

For example, in the internal space V, the material quality of the annular sealing member may be deteriorated by influence from a vacuum environment, a depressurized environment, and a process-gas-filled environment. By the way, the respective annular sealing members 5A, 5B are disposed at different positions in the axial direction of the shaft 31, and contact the radial outer surface 32$p$ of the rotary portion 32. Therefore, of the two spaces having different pressures of the rotation mechanism 1, material quality providing high sealing performance such as polyethylene is used for the annular sealing member 5B positioned on the high pressure side (external space E side), and a material providing high corrosion resistance such as polytetrafluoroethylene is used for the annular sealing member 5A positioned on the low pressure side (internal space V side). This suppresses influence from a vacuum environment, a depressurized environment, and a process-gas-filled environment in the internal space V on the annular sealing member 5B providing high sealing performance, thereby suppressing deterioration of the annular sealing member 5B caused by gas and the like. Since the pressure on the high pressure side (external space E side) is reduced by the annular sealing member 5B, the annular sealing member 5A only receives little pressure. Further, the respective annular sealing members 5A, 5B can exert appropriate sealing performance according to the different positions in the axial direction of the shaft 31, and progression of deterioration of the annular sealing members 5A, 5B such as abrasion can be suppressed.

As illustrated in FIG. 4, when the lid portion 23 is fixed to the housing flange portion 22 with the bolt 27, the seal fixing spacer 25 sandwiches the seal flange portion 54 inserted into the seal fixing recessed portion 25$b$ with the lid portion 23, and fixes the same. By this, the annular sealing member 5A includes the seal flange portion 54. Therefore, the rotation mechanism 1 of the first embodiment can reduce possibility that the annular sealing member 5A is rotated together with rotation of the rotary portion 32. When the lid portion 23 is fixed to the housing flange portion 22 with the bolt 27, the seal fixing spacer 25 presses the seal fixing spacer 28. The seal fixing spacer 25 sandwiches the seal flange portion 54 inserted into the seal fixing recessed portion 28$b$ with the seal fixing spacer 28, and fixes the same. By this, the annular sealing member 5B includes the seal flange portion 54. Therefore, the rotation mechanism 1 of the first embodiment can reduce possibility that the annular sealing member 5B is rotated together with rotation of the rotary portion 32.

The lid portion 23 can adjust a vacuum level by appropriately setting a distance $\Delta d1$ of a gap s1 between a radial inner diameter side surface 23$f$ and the radial outer surface 32$p$. Preferably, the distance $\Delta d1$ is 0.001 mm or more and 0.5 mm or less, for example. In the same manner, the annular projecting portion 25$e$ can adjust a vacuum level by appropriately setting a distance $\Delta d2$ of a gap s2 between a radial inner diameter side surface 25$f$ and the radial outer surface 32$p$. Preferably, the distance $\Delta d2$ is 0.001 mm or more and 0.5 mm or less, for example. Further, the annular projecting portion 28$e$ can adjust a vacuum level by appropriately setting a distance $\Delta d3$ of a gap s3 between a radial inner diameter side surface 28$f$ and the radial outer surface 32$p$. Preferably, the distance $\Delta d3$ is 0.001 mm or more and 0.5 mm or less, for example. In the case of reducing the distance Δd1, distance Δd2, and distance Δd3, a lubricant such as grease can be easily held in the gap 55.

As illustrated in FIG. 4, a biasing member 56 is disposed inside each of the spaces surrounded by the fixing portion 52, annular connecting unit 53, and lip portion 51, and pressing force of the lip portion 51 can be biased to the rotary portion 32 side. Each of the biasing members 56 is, for example, made of stainless steel or the like and is an elastic body formed in a V-shape in a cross-sectional view by bending, at a bending portion 56c, a plate-like portion 56a and a plate-like portion 56b, both of which are flat plates. Each of the biasing members 56 performs biasing such that ends of the plate-like portion 56a and plate-like portion 56b are mutually outstretched.

In the annular sealing members 5A, 5B, the lip portion 51 has the pressure caused by elastic deformation of the lip portion 51 and receives the pressure applied to the biasing member 56, thus the lip portion 51 contacts the radial outer surface 32p of the rotary portion 32. Therefore, the rotation mechanism 1 can increase a contact pressure of the lip portion 51 to the radial outer surface 32p of the rotary portion 32. Further, the space surrounded by the fixing portion 52, annular connecting unit 53, and lip portion 51 is opened to the external space E that is the high-pressure side space of the two spaces having the different pressures. Therefore, a pressure difference between the two spaces having the different pressures can increase the contact pressure of the lip portion 51 that contacts the radial outer surface 32p of the rotary portion 32. This enables the rotation mechanism 1 to keep high sealing performance even when the internal space V is highly vacuumed. Further, not only an inner peripheral side end 51a of the lip portion 51 contacts the radial outer surface 32p but also at least a part of an inner peripheral side base portion 51d of the lip portion 51 close to the annular connecting unit 53 contacts the radial outer surface 32p. As a result, the sealing performance can be secured because the inner peripheral side of the lip portion 51 comes into surface contact with the radial outer surface 32p.

Even when abrasion or deformation is caused at the lip portion 51 or the shaft 31, the biasing member 56 functions so as to secure the contact pressure. Therefore, the rotation mechanism 1 can reduce frequency of replacing the shaft 31 or the annular sealing members 5A, 5B serving as components that improve sealing performance.

As described above, the rotation mechanism 1 can function as the separator between the two spaces that are the internal space V and the external space E having the different pressures. The rotation mechanism 1 includes: the housing 2; the shaft 31 inserted into the housing 2; the bearing 4 provided at the housing 2 and supporting the shaft 31 in a rotatable manner; the rotary portion 32 fixed to the one end portion of the shaft 31 as a separate body, rotated together with the shaft 31, and further having the radial outer surface 32p facing the seal fixing spacer 25 of the housing 2 with the gap 55 having the predetermined size; and the annular sealing members 5A, 5B. The annular sealing members 5A, 5B seal the gap 55.

With this structure, in the rotation mechanism 1, work efficiency of component replacement can be improved by disassembling and removing the rotary portion 32 from the shaft 31 out of the rotation mechanism 1. After replacement of the rotary portion, the shaft 31 can be put back to the rotation mechanism 1 and used in the rotation mechanism 1. Therefore, lifetime of the shaft 31 is extended and cost can be reduced. Further, according to an assembling method of the rotation mechanism 1, the rotation mechanism 1 is disassembled, the abraded rotary portion 32 is removed from the shaft 31, then a new rotary portion 32 is fixed to the shaft 31, and the rotation mechanism 1 is assembled. Therefore, it is not necessary to replace a whole shaft 31.

Further, the annular sealing members 5A, 5B respectively include different material quality, and disposed at the different positions in the axial direction parallel to the rotational center axis Zr of the shaft 31. These annular sealing members 5A, 5B seal the gap 55.

This structure suppresses the influence from a vacuum environment, a depressurized environment, and a process-gas-filled environment in the internal space V on the annular sealing member 5B positioned closer to the high-pressure side space, thereby suppressing deterioration of the annular sealing members 5A, 5B caused by gas and the like. Since the pressure on the high pressure side (external space E) is reduced by the annular sealing member 5B, the annular sealing member 5A positioned closer to the low-pressure side space only receives little pressure. Further, the respective annular sealing members 5A, 5B can exert appropriate sealing performance according to the different positions in the axial direction of the shaft 31, and progression of deterioration the annular sealing members 5A, 5B such as abrasion can be suppressed.

The annular sealing members 5A, 5B according to the first embodiment may be so-called O-rings having circle shape cross-sections, but as described above, preferably include the fixing portion 52 that contacts the seal fixing spacer 25 of the housing 2, the lip portion 51 that contacts the radial outer surface 32p of the rotary portion 32, and the annular connecting unit 53 that connects the fixing portion 52 to the lip portion 51. The biasing member 56 biases pressing force of the lip portion 51 to the rotary portion 32 side. Since the rotation mechanism 1 can increase contact pressures of the annular sealing members 5A, 5B that contact the rotary portion 32, high sealing performance can be achieved. By this, a high vacuum state is achieved in the rotation mechanism 1 by decreasing the pressure in one of the two spaces having the different pressures. Further, even when a size of the lip portion 51 is changed by abrasion, degradation of sealing performance can be suppressed because the biasing member 56 presses the lip portion 51. Therefore, the rotation mechanism 1 can improve sealing performance. Further, the rotation mechanism 1 can reduce frequency of replacing the component that improves sealing performance.

The space surrounded by the lip portion 51, annular connecting unit 53, and fixing portion 52 is opened to the external space E on the high pressure side of the two spaces that are the internal space V and the external space E having the different pressures. With this structure, the pressure caused by own elastic deformation of the lip portions 51 of the annular sealing members 5A, 5B and the pressure applied by the biasing member 56 synergistically work, and the contact pressures of the annular sealing members 5A, 5B that contact the rotary portion 32 can be increased.

Preferably, the biasing member 56 is provided in the space surrounded by the fixing portion 52, annular connecting unit 53, and lip portion 51. With this structure, the lip portion 51 can easily come into surface contact with the rotary portion 32.

Second Embodiment

Figure 5:
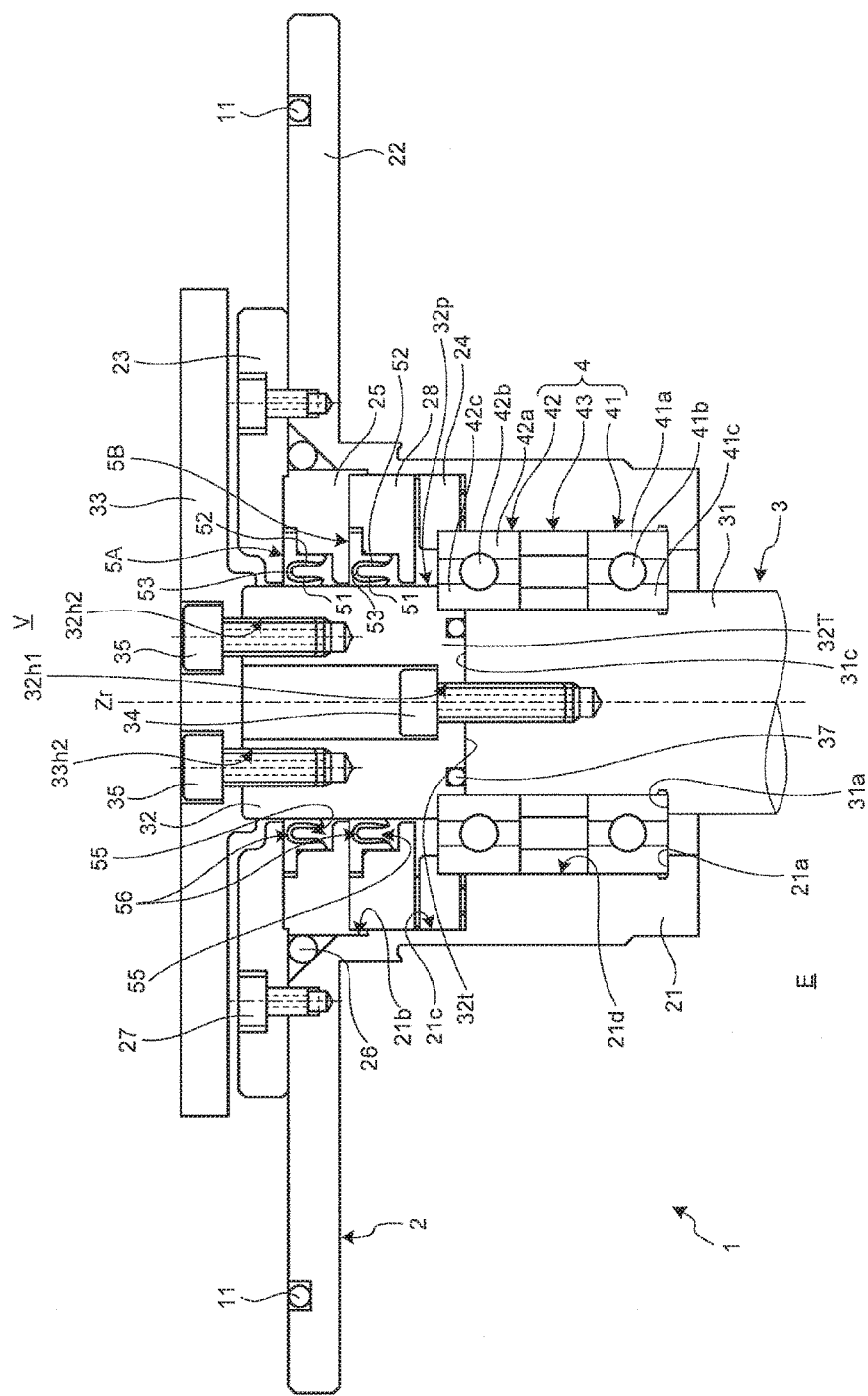
FIG. 5 is a cross-sectional view schematically illustrating the rotation mechanism according to a second embodiment.

FIG. 5 is a cross-sectional view schematically illustrating a rotation mechanism according to a second embodiment. Components that are the same as those of the first embodiment described above will be denoted by the same reference signs, and a description therefore will be omitted. A rotation mechanism 1 according to the second embodiment has a solid structure that does not include, in a hollow portion inside a rotary portion 32, a recessed inner wall 32u into which one end 31c of a shaft 31 can be inserted. A projecting portion 32T provided at one end 32t of the rotary portion 32 is shaped in a circle in a planar view, and the circle diameter is smaller than a radial outer surface 32p of the rotary portion 32. The projecting portion 32T is inserted into a space surrounded by an inner peripheral side of an inner ring 42c and engaged with an inner ring 42c. The one end 32t of the rotary portion 32 abuts on the one end 31c of the shaft 31. The projecting portion 32T includes an O-ring (second annular sealing member) 37 fitted into an annular groove annularly recessed on a flat surface parallel to an axial direction. The O-ring (second annular sealing member) 37 suppresses gas leakage via a through-hole 32h1, and can improve sealing performance of the rotation mechanism 1. Note that the annular groove may be provided at the one end 31c of the shaft 31, and the O-ring (second annular sealing member) 37 may also be provided on the shaft 31 side.

In the rotation mechanism 1 according to the second embodiment, a rotational center axis of the rotary portion 32 coincides with a rotational center axis of the shaft 31. Therefore, adjustment work for the rotational center axes Zr is not needed. Therefore, component replacement at the time of maintenance is facilitated in the rotation mechanism 1 according to the second embodiment.

As illustrated in FIG. 5, each of the biasing members 56 is, for example, made of stainless steel or the like and is an elastic body formed in a U-shape in a cross-sectional view obtained by bending, at a bending portion 56c, a plate-like portion 56a and a plate-like portion 56b which are flat plates. The bending portion 56c is bent so as to have a predetermined curvature. Further, each of the biasing members 56 performs biasing such that ends of the plate-like portion 56a and plate-like portion 56b are mutually outstretched.

Third Embodiment

Figure 6:
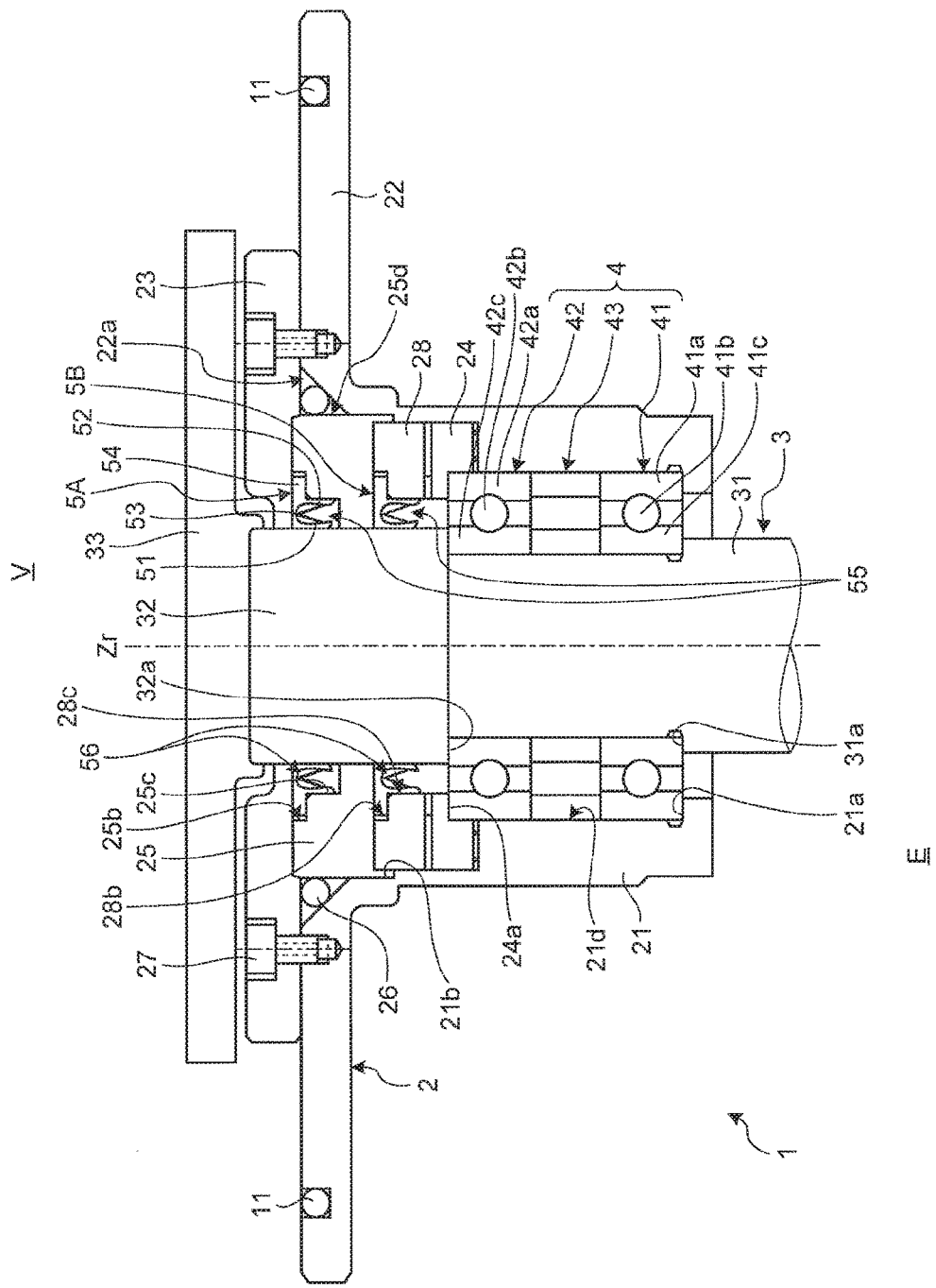
FIG. 6 is a cross-sectional view schematically illustrating the rotation mechanism according to a third embodiment.

FIG. 6 is a cross-sectional view schematically illustrating a rotation mechanism according to a third embodiment. Components that are the same as those of the first embodiment or the second embodiment described above will be denoted by the same reference signs, and a description therefore will be omitted. A rotation mechanism 1 according to the third embodiment does not include a recessed inner wall 32u whereby one end 31c of a shaft 31 can be inserted in a hollow portion inside a rotary portion 32, and the rotary portion 32 is incorporated with the shaft 31 and is a part of the one end of the shaft 31.

Fourth Embodiment

A rotation mechanism 1 according to a fourth embodiment is a mechanism that is the same as the rotation mechanisms in the first embodiment to the third embodiment, but material quality of annular sealing members 5A, 5B is different. Components that are the same as those of the first embodiment, the second embodiment, or the third embodiment described above will be denoted by the same reference signs, and a description therefore will be omitted.

For example, in an internal space V, the material quality of the annular sealing member may be deteriorated by influence from a vacuum environment, a depressurized environment, and a process-gas-filled environment. By the way, the respective annular sealing members 5A, 5B are disposed at different positions in an axial direction of a shaft 31 and contact a radial outer surface 32p of a rotary portion 32. Therefore, of two spaces having different pressures of the rotation mechanism 1, material quality providing high sealing performance and low hardness such as polyethylene is used for the annular sealing member 5B positioned on a high pressure side (external space E side), and a material providing high durability and high hardness such as polytetrafluoroethylene is used for the annular sealing member 5A positioned on a low pressure side (internal space V side).

Thus, the material harder than the annular sealing member 5A positioned closer to the low-pressure side space (internal space V) is used for the annular sealing member 5B positioned closer to the high-pressure side space (external space E) of the two spaces having the different pressures. This suppresses influence from a vacuum environment, a depressurized environment, and a process-gas-filled environment in the internal space V on the annular sealing member 5B positioned closer to the high-pressure side space (external space E), thereby suppressing deterioration of the annular sealing member 5B caused by gas and the like. Since the pressure on the high pressure side (external space E) is reduced by the annular sealing member 5B, the annular sealing member 5A positioned closer to the low-pressure side space (internal space V) only receives little pressure. This enables the annular sealing members 5A, 5B to exert appropriate sealing performance respectively according to the different positions in the axial direction of the shaft 31, and progression of deterioration of the annular sealing members 5A, 5B such as abrasion can be suppressed.

Fifth Embodiment

Figure 7:
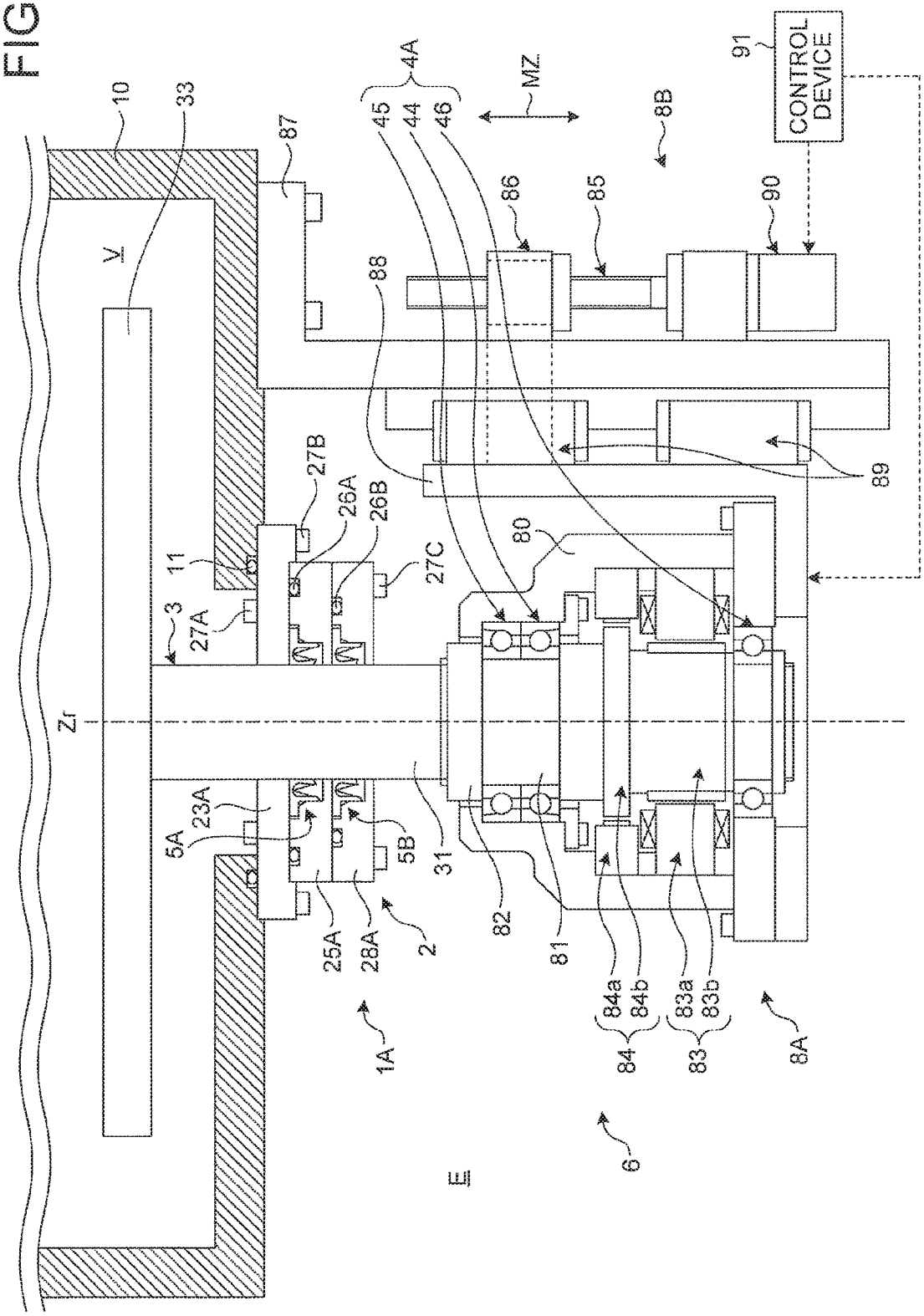
FIG. 7 is a cross-sectional view schematically illustrating a sealing mechanism according to a fifth embodiment.

FIG. 7 is a cross-sectional view schematically illustrating a sealing mechanism according to a fifth embodiment. A sealing mechanism 1A according to the fifth embodiment functioning as a separator between two spaces having different pressures in the same manner as the rotation mechanism 1 according to the first to fourth embodiments, but is different in that a shaft 31 can be linearly moved in an axial direction of the shaft 31 in addition to rotary movement. Material quality of annular sealing members 5A, 5B is different. Components that are the same as those of the first to fourth embodiments described above will be denoted by the same reference signs, and a description therefore will be omitted.

The sealing mechanism 1A according to the fifth embodiment includes a housing 2 and a rotary member 3. Unlike the above-described rotation mechanism 1 according to the first embodiment, the housing 2 does not house a bearing 4, and the shaft 31 passes therethrough. Thus, unlike the above-described rotation mechanism 1, an axial position of the shaft 31 is not restricted by the bearing 4 or the like in the sealing mechanism 1A according to the fifth embodiment. In the fifth embodiment, the housing 2 includes, as a housing body, a seal fixing spacer 28A, a seal fixing spacer 25A, and a lid portion 23A. The seal fixing spacer 28A, the seal fixing spacer 25A, and the lid portion 23A are stacked in the axial direction. The lid portion 23A according to the fifth embodiment is fixed to the seal fixing spacer 25A with a fixing member 27A such as a bolt. The lid portion 23A according to the fifth embodiment includes a portion overlapping with a frame body 10 in a planar view and fixed to the frame body 10 with a fixing member 27B such as a bolt in the same manner as the housing flange portion 22 according to the first embodiment. The lid portion 23A according to the fifth embodiment includes an annular groove provided at the portion overlapping with the frame body 10 in a planar view, and an O-ring (annular seal) 11 is fitted into the annular groove to improve sealing performance between the lid portion 23A and the frame body 10. The lid portion 23A is fixed to the seal fixing spacer 25A with the fixing member 27A such as a bolt, and thus an O-ring (third annular sealing member) 26A fitted into the annular groove functions as a seal with improved sealing performance. Further, the lid portion 23A abuts on an axial one end of the seal fixing spacer 25A. Further, the O-ring (third annular sealing member) 26A is disposed at a position where a diameter thereof is larger than the annular sealing member 5A.

The seal fixing spacer 28A according to the fifth embodiment includes a portion overlapping with the seal fixing spacer 25A in a planar view and fixed with a fixing member 27C such as a bolt. The seal fixing spacer 28A according to the fifth embodiment includes an annular groove in the portion overlapping with the seal fixing spacer 25A in a planar view, and an O-ring (third annular sealing member) 26B is fitted into the annular groove to improve sealing performance between the seal fixing spacer 25A and the seal fixing spacer 28A. The seal fixing spacer 28A is fixed to the seal fixing spacer 25A with the fixing member 27C such as a bolt, and thus the O-ring 26B fitted into the annular groove functions as a seal with improved sealing performance. Further, the seal fixing spacer 28A abuts on the other axial end of the seal fixing spacer 25A. Further, the O-ring 26B is disposed at a position where a diameter thereof is larger than an annular sealing member 5B.

A drive unit 6 of the sealing mechanism according to the fifth embodiment includes a rotary drive unit 8A and a linear drive unit 8B. The rotary drive unit 8A and the linear drive unit 8B are connected by a linear guiding mechanism 89.

The rotary member 3 includes the shaft 31 and a conveyance table (movable member) 33. The shaft 31 is an output shaft (main shaft) of the sealing mechanism 1A and has one end portion inserted into the housing 2. The shaft 31 has the other portion connected to an output shaft 81 of a motor unit 83 of the rotary drive unit 8A via a coupling 82. The conveyance table (movable member) 33 is fixed to the one end portion of the shaft 31.

The rotary drive unit 8A includes the motor unit 83 and a detector 84 to detect rotation of the output shaft 81 inside a motor housing 80. The motor unit 83 includes a motor stator 83a and a motor rotor 83b inside the motor housing 80.

The motor unit 83 is supported by a bearing 4A combined with bearings 44, 45, 46 such that the motor rotor 83b can be freely rotated around a rotational center axis Zr relative to the motor housing 80. The motor housing 80 is cylindrically formed in a hollow cylindrical shape around the rotational center axis Zr, and the motor stator 83a and outer rings of the bearings 44, 45, 46 are fixed to an inner peripheral side of the motor housing 80. Further, inner rings of the bearings 44, 45, 46 are fixed to an outer periphery of the output shaft 81. The bearing 4A can also support the shaft 31 in a rotatable manner because the other end portion of the shaft 31 is connected to the output shaft 81 of the motor unit 83 of the rotary drive unit 8A via the coupling 82.

An exciting coil is wound around the motor stator 83a via an insulating insulator. The motor stator 83a has a cylindrical body formed in a cylindrical shape manufactured by stacking thin plates such as an electromagnetic steel plate and a cold-rolled steel sheet by means of bonding, boss, caulking, and the like. The exciting coil is a liner wire and able to generate a rotation magnetic field by receiving power supply under control of a control device 91 and exciting the motor stator 83a. The motor stator 83a is a so-called stator of the motor unit 83.

In the motor rotor 83b, magnets are fixed on an outer peripheral side of a core material around the rotational center axis Zr. In the motor rotor 83b, the magnets are provided in a circumferential direction and attached along an outer peripheral surface on a radially outer side of the motor rotor 83b. The magnets are permanent magnets, S poles and N poles are alternately arranged at equal intervals in the circumferential direction of the motor rotor 83b. This type of motor rotor 83b can be called as a permanent magnet (PM) type rotor. The motor rotor 83b is rotated in accordance with the rotation magnetic field excited at teeth of the motor stator core by the exciting coil.

The detector 84 is, for example, a resolver device and positioned at an end portion in the axial direction (direction parallel to rotation center) of the motor unit 83. The detector 84 includes a resolver stator 84a and a resolver rotor 84b. The resolver rotor 84b is fixed at one end of the motor rotor 83b. The resolver stator 84a is fixed at the motor housing 80. The detector 84 can output a detection signal from the resolver stator 84a in accordance with rotation of the resolver rotor 84b linked with rotation of the motor rotor 83b. The control device 91 receives the detection signal from the resolver stator 84a and can detect rotation of the output shaft 81. The detector 84 is not limited to the resolver device and may also be, for example, another magnetic sensor or rotation detection sensor.

The linear drive unit 8B includes a drive motor 90, a screw shaft 85, a connecting unit 86, a support member 87, a positioning portion 88, and the linear guiding mechanism 89. The drive motor 90 is an electric motor same as an electric motor 8. The structure of the linear drive unit 8B is not limited thereto. The linear drive unit 8B may be any linear drive unit that provides freedom of movement in linear movement parallel to the shaft direction of the shaft 31.

The drive motor 90 has a base position fixed by the support member 87 relative to the frame body 10. The screw shaft 85 and the connecting unit 86 form a ball screw mechanism, and the drive motor 90 converts transmitted rotation of the screw shaft 85 to linear movement and moves the connecting unit 86 in a MZ direction parallel to an extending direction of the screw shaft 85 (axial direction of the screw shaft 85). The connecting unit 86 is connected to the positioning portion 88, and the position of the positioning portion 88 moves together with a position determined based on guide of the linear guiding mechanism 89 in accordance with linear movement of the connecting unit 86. The positioning portion 88 is a table, and the rotary drive unit 8A is mounted on an upper surface thereof. Therefore, the linear drive unit 8B can linearly move the shaft 31 together with the rotary drive unit 8A along the axial direction of the shaft 31 (linear movement).

The control device 91 according to the fifth embodiment controls the motor unit 83 of the rotary drive unit 8A and the drive motor 90 of the linear drive unit 8B to provide the shaft 31 with at least one of rotary movement and linear movement. Therefore, the control device 91 according to the fifth embodiment can control the motor unit 83 of the rotary drive unit 8A and the drive motor 90 of the linear drive unit 8B so as to provide the conveyance table (movable member) 33 with at least one of rotary movement and linear movement. Further, a conveyance device 7 includes the conveyance table (movable member) 33 to move a conveyance object. The conveyance device 7 moves the conveyance object by linking movement of the conveyance table (movable member) 33 with at least one of the rotary movement and the linear movement.

In the annular sealing members 5A, 5B according to the fifth embodiment also, the material quality of the annular sealing member may be deteriorated in an internal space V by, for example, influence from a vacuum environment, a depressurized environment, and a process-gas-filled environment. By the way, the respective annular sealing members 5A, 5B are disposed at different positions in the axial direction of the shaft 31, and contact the radial outer the radial outer surface of the shaft 31. Therefore, of the two spaces having different pressures of the sealing mechanism 1A, material quality providing high sealing performance such as polyethylene is used for the annular sealing member 5B positioned on the high pressure side (external space E side), and a material providing corrosion resistance such as polytetrafluoroethylene is used for the annular sealing member 5A positioned on the low pressure side (internal space V side). This suppresses influence from a vacuum environment, a depressurized environment, and a process-gas-filled environment in the internal space V on the annular sealing member 5B providing high sealing performance, thereby suppressing deterioration of the annular sealing member 5B caused by gas and the like. Since the pressure on the high pressure side (external space E side) is reduced by the annular sealing member 5B, the annular sealing member 5A only receives little pressure. Further, the respective annular sealing members 5A, 5B can exert appropriate sealing performance according to the different positions in the axial direction of the shaft 31, and progression of deterioration of the annular sealing members 5A, 5B such as abrasion can be suppressed. The annular sealing members 5A, 5B are not limited to two, and three or more annular sealing members may be provided as well. The plurality of annular sealing members 5A, 5B can improve sealing performance of the sealing mechanism 1A. Since the material quality of the respective annular sealing member 5A, 5B are different, both corrosion resistance and durability can be secured.

Stress of rotary movement and linear movement is applied to the annular sealing members 5A, 5B according to the fifth embodiment. Therefore, preferably, strength of the annular sealing members 5A, 5B is stronger than strength of elasticity modulus of 0.1 GPa.

Sixth Embodiment

Figure 8:
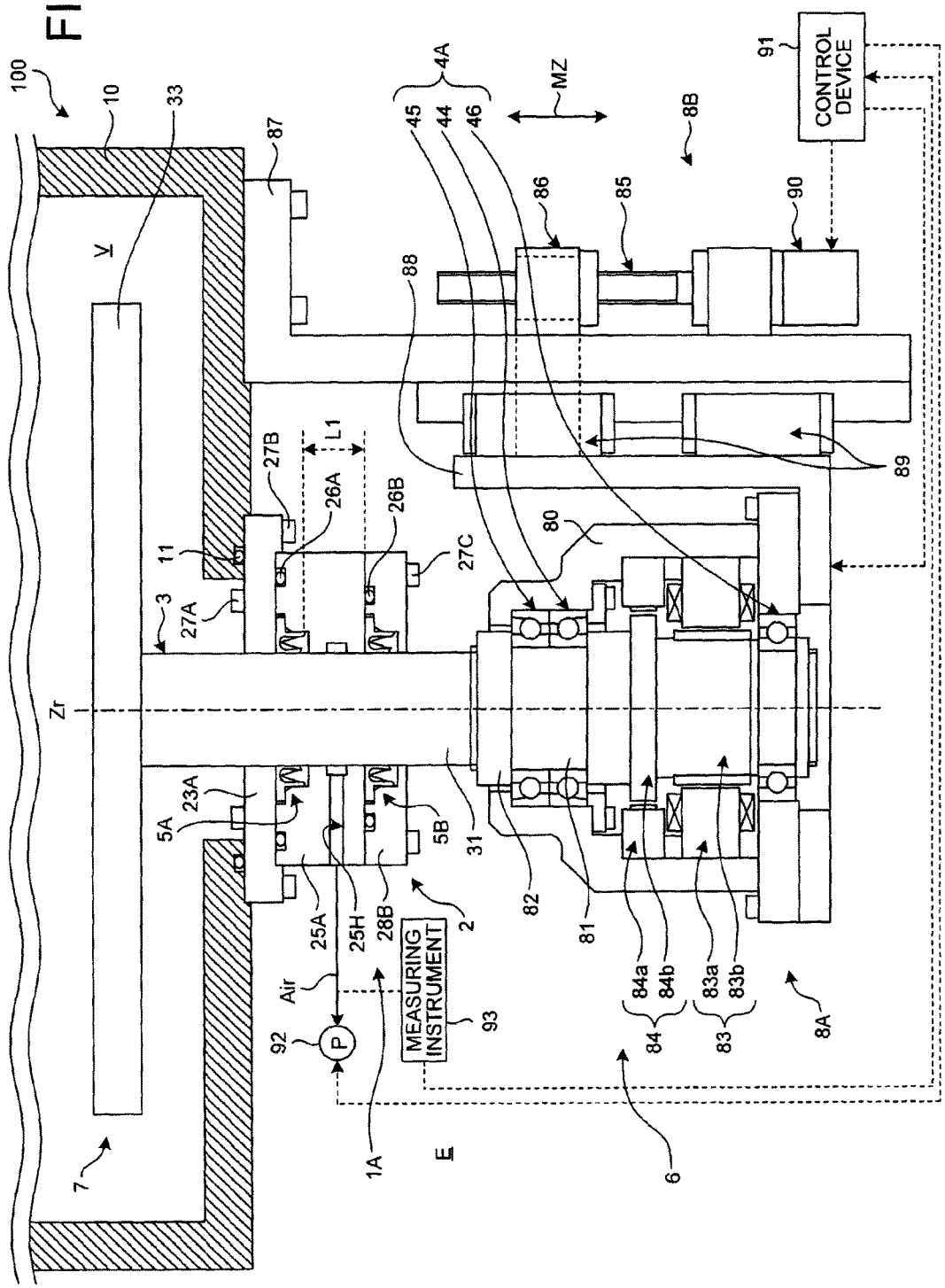
FIG. 8 is a cross-sectional view schematically illustrating a sealing mechanism according to a sixth embodiment.

FIG. 8 is a cross-sectional view schematically illustrating a sealing mechanism according to a sixth embodiment. Components that are the same as those of the first to fifth embodiments described above will be denoted by the same reference signs, and a description therefore will be omitted.

Annular sealing members 5A, 5B according to the sixth embodiment are arranged apart from each other by a length L1 in an axial direction. Among a plurality of annular sealing members in a sealing mechanism 1A according to the sixth embodiment, annular sealing members in at least one pair of the annular sealing members 5A, 5B adjacent to each other are different in material quality. Different lubricants may be suitable for the annular sealing members 5A, 5B having the different material quality. In the case of using different lubricants for the annular sealing members 5A, 5B having the different material quality respectively, an outer peripheral surface of the shaft 31 to which the different lubricants are adhered may contact both of the annular sealing members 5A, 5B when a shaft 31 is moved linearly in the axial direction as described above.

In the sealing mechanism 1A according to the sixth embodiment, preferably, the length L1 is equal to or more than a stroke corresponding to a maximum length allowed by linear movement of the shaft 31. This makes is possible to use different lubricants respectively for the annular sealing members 5A, 5B having the different material quality. As a result, mixture of the different lubricants is suppressed, and long-lasting effects of lubrication can be secured by the respective different lubricants.

A pressure in a space between the annular sealing member 5A and the annular sealing member 5B (hereinafter referred to as pressure between seals) is an intermediate pressure between an internal space V and an external space E of a frame body 10. Alternatively, in the case where sealing performance of the annular sealing member 5A is lower than the annular sealing member 5B by putting priority on corrosion resistance performance, the pressure between the seals becomes close to the pressure in the internal space V of the frame body 10, for example, low vacuum.

The pressure between the seals changes in a manner of primary delay relative to a state change on the internal space V side of the frame body 10. Therefore, in a sealing mechanism 1A according to the above-described fifth embodiment, preferably, a period until the pressure between the seals is stabilized is secured as a warm-up time. In contrast, the sealing mechanism 1A according to the sixth embodiment includes a flow passage 25H in a housing 2, and the flow passage 25H functions as an exhaust line or a suction line connected to the space between the annular sealing member 5A and the annular sealing member 5B. The pressure between the seals becomes constant by exhausting or suctioning a gas Air in a space between the annular sealing member 5A and the annular sealing member 5B via the flow passage 25H. As a result, the warm-up time can be shortened in the sealing mechanism 1A according to the sixth embodiment.

The sealing mechanism 1A according to the sixth embodiment may further includes: a pump as a pressure changing device 92; and a measuring instrument 93 to measure a pressure or a gas flow rate inside the flow passage 25H. A control device 91 may perform pressure control by controlling an exhaust amount or a sucking amount of the gas Air of the pressure changing device 92 based on the measured pressure or gas flow rate inside the flow passage 25H so as to make the pressure between the seals constant. By this, the warm-up time can be shortened in the sealing mechanism 1A according to the sixth embodiment.

The sealing mechanism 1A according to the sixth embodiment records temporal change of the pressure or the gas flow rate inside the flow passage 25H measured by the control device 91. In the case where a measured value exceeds a threshold value, the sealing mechanism 1A can issue a warning to notify deterioration of the annular sealing members 5A or the annular sealing member 5B. As a result, replacement timing of the annular sealing members 5A or the annular sealing member 5B can be determined before serious influence is given to the internal space V of the frame body 10.

Seventh Embodiment

Figure 9:
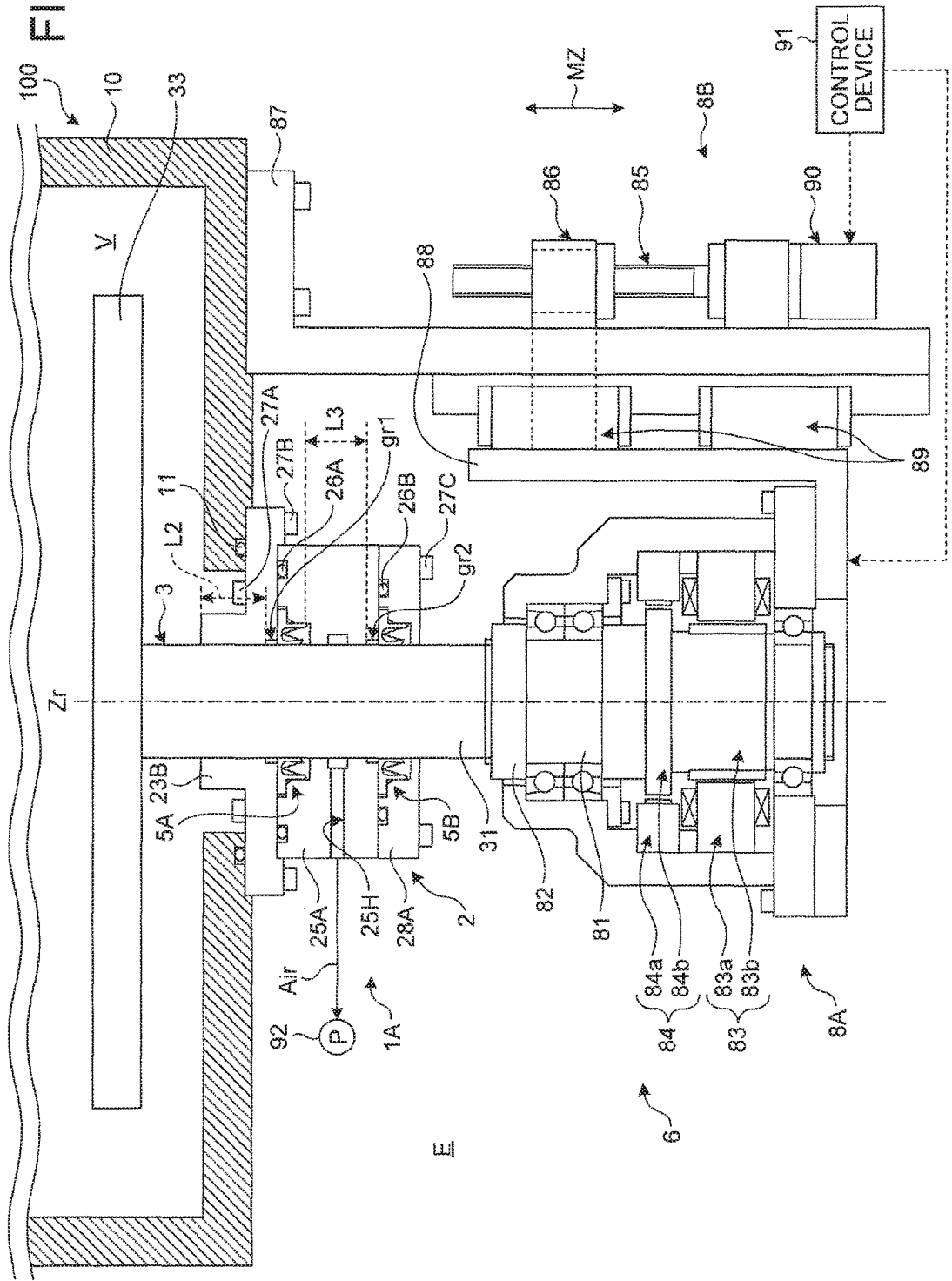
FIG. 9 is a cross-sectional view schematically illustrating a sealing mechanism according to a seventh embodiment.

FIG. 9 is a cross-sectional view schematically illustrating a sealing mechanism according to a seventh embodiment. Components that are the same as those of the first to sixth embodiments described above will be denoted by the same reference signs, and a description therefore will be omitted.

A sealing mechanism 1A according to the seventh embodiment includes, as a housing body 2, a seal fixing spacer 28A, a seal fixing spacer 25A, and a lid portion 23B. The seal fixing spacer 28A, the seal fixing spacer 25A, and the lid portion 23B are stacked in an axial direction. The lid portion 23B has an annular groove gr1 disposed close to an internal space V side of an annular sealing member 5A, and stores a lubricant for the annular sealing member 5A in a space of the groove gr1. By this, the annular sealing member 5A is constantly supplied with the lubricant from the groove gr1. A length L2 from a surface of the lid portion 23B on the internal space V side to the groove gr1 is, preferably, equal to or more than a stroke corresponding to a maximum length allowed by linear movement of a shaft 31. This enables the sealing mechanism 1A according to the seventh embodiment to reduce possibility of causing degradation (deterioration) of a vacuum level by a lubricant adhered to a surface of the shaft 31 from the groove gr1 in the case where, for example, the internal space V is in a high vacuum environment. Here, to obtain the length L2, in the sealing mechanism 1A according to the seventh embodiment, an end portion of the lid portion 23B on the internal space V side of a frame body 10 includes a cylindrical portion having a cylindrical shape on the shaft 31 side, and an outer peripheral side of the cylindrical portion is formed uneven. The structure to obtain the length L2 is not limited to the above unevenness, and the sealing mechanism 1A according to the seventh embodiment can be downsized by using the lid portion 23B.

In the sealing mechanism 1A according to the seventh embodiment, the seal fixing spacer 25A has an annular groove gr2 disposed closer to the internal space V side of an annular sealing member 5B, and stores a lubricant for the annular sealing member 5B in a space of the groove gr2. By this, the annular sealing member 5B is constantly supplied with the lubricant from the groove gr2. A length L3 from the annular sealing member 5A to the groove gr2 is, preferably, equal to or more than a stroke corresponding to a maximum length allowed by linear movement of a shaft 31. This suppresses mixture of different lubricants, and long-lasting effects of lubrication can be secured by the respective different lubricants, even in the case of using the different lubricants for the respective annular sealing members 5A, 5B having different material quality.

The sealing mechanism 1A according to the seventh embodiment includes the grooves gr1, gr2 as storage portions for the lubricants. The groove gr1, gr2 are not necessarily holes and may have any shape that can store a lubricant.

In the sealing mechanism 1A according to the seventh embodiment, a pump provided as the pressure changing device 92 constantly performs exhausting operation inside the flow passage 25H. By performing exhausting operation, the sealing mechanism 1A according to the seventh embodiment can achieve not only shortening of a warm-up time but also high sealing performance.

Eighth Embodiment

Figure 10:
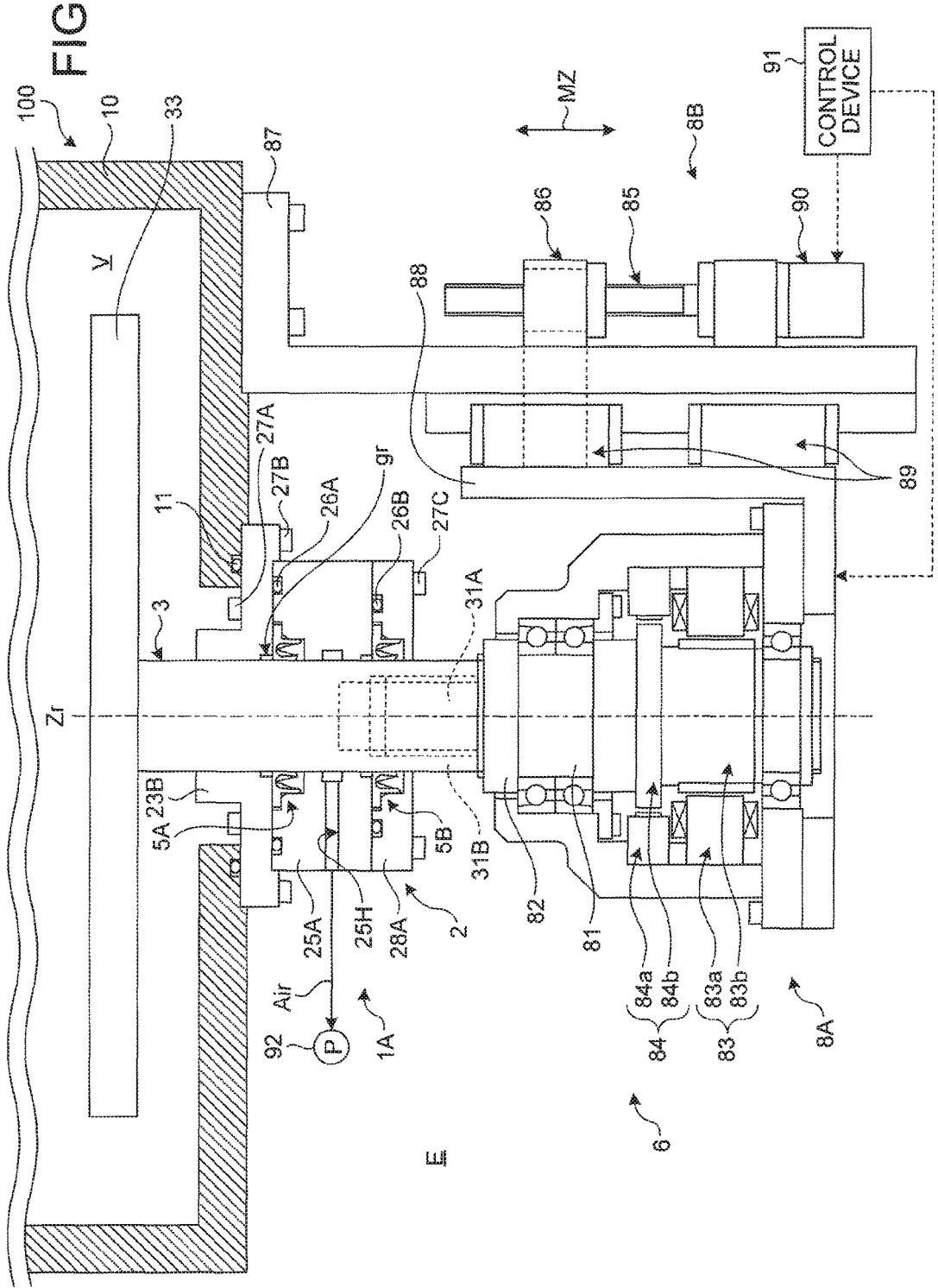
FIG. 10 is a cross-sectional view schematically illustrating a sealing mechanism according to an eighth embodiment.

FIG. 10 is a cross-sectional view schematically illustrating a sealing mechanism according to an eighth embodiment. Components that are the same as those of the first to seventh embodiments described above will be denoted by the same reference signs, and a description therefore will be omitted.

In a sealing mechanism 1A according to the eighth embodiment, a rotary member 3 includes a shaft 31A and an outer peripheral portion 31B. The outer peripheral portion 31B has a cylindrical shape including a hollow recessed portion in the same manner as the rotary portion 32 of the first embodiment, and a radial outer surface of outer peripheral portion 31B faces a housing 2 with a gap having a predetermined size therebetween. The outer peripheral portion 31B of the eighth embodiment is coaxial with the shaft 31A, but the outer peripheral portion 31B has a diameter larger than the diameter of the shaft 31A. The annular sealing members 5A, 5B contact a part of an outer periphery of the outer peripheral portion 31B. Work efficiency of component replacement can be improved by disassembling and removing the outer peripheral portion 31B from the shaft 31A out of the rotary member 3. After replacement of the outer peripheral portion 31B, the shaft 31A can be put back to the sealing mechanism 1A and used in the sealing mechanism 1A. Therefore, lifetime of the shaft 31A is extended, and cost can be reduced.

While the first to eighth embodiments have been described, the present invention is not limited by the matters described above. Further, at least one of various kinds of omission, replacement, and modifications can be made in respect to the components in a range without departing from the gist of the first to eighth embodiments.

The invention claimed is:

1. A sealing mechanism functioning as a separator between two spaces having different pressures, comprising:
   a housing;
   a shaft inserted into the housing; and
   a plurality of annular sealing members sealing a gap by contacting a part of the shaft or a radial outer surface of a rotary portion fixed to the shaft, wherein
   the respective annular sealing members include materials having different material quality and are disposed at different positions in an axial direction parallel to a center axis of the shaft, and
   a storage portion that supplies a lubricant is provided to each of the plurality of annular sealing members at a position proximate a low-pressure side space with respect to a corresponding annular sealing member.

2. The sealing mechanism according to claim 1, wherein an annular sealing member positioned closer to a high-pressure side space of the two spaces having different pressures includes material having material quality of high sealing performance, and an annular sealing member positioned closer to a low-pressure side space includes material having material quality of high corrosion resistance.

3. The sealing mechanism according to claim 1, wherein the respective annular sealing members includes materials having different hardness, and an annular sealing member positioned closer to the high-pressure side space out of the two spaces having the different pressures includes a material harder than an annular sealing member positioned closer to a low-pressure side space.

4. The sealing mechanism according to claim 1, wherein the annular sealing member includes a fixing portion contacting the housing, a lip portion contacting the radial outer surface of the rotary portion, and an annular connecting unit connecting the fixing portion to the lip portion.

5. The sealing mechanism according to claim 4, further comprising a biasing member that biases pressing force of the lip portion to a rotary portion side,
   wherein the biasing member is disposed in a space surrounded by the lip portion, the annular connecting unit, and the fixing portion.

6. The sealing mechanism according to claim 1, wherein the shaft is supported in a rotatable manner.

7. The sealing mechanism according to claim 1, wherein the shaft is supported in a linearly movable manner such that a relative position to the housing is changed in the axial direction.

8. The sealing mechanism according to claim 7, wherein a length between annular sealing members adjacent to each other in the axial direction among the plurality of annular sealing members is longer than a stroke in the axial direction in which the shaft can be linearly moved.

9. The sealing mechanism according to claim 8, wherein a lubricant for one of the annular sealing members adjacent to each other in the axial direction has different material quality from that of a lubricant for the other of annular sealing members.

10. The sealing mechanism according to claim 7, wherein
wherein the storage portion is provided in one of annular sealing members disposed adjacent each other in the axial direction among the plurality of annular sealing members, and
a distance from the storage portion to the other annular sealing member of the annular sealing members adjacent each other in the axial direction is longer than a stroke in the axial direction in which the shaft can be linearly moved.

11. The sealing mechanism according to claim 1, comprising a flow passage for exhausting and suctioning operation, the flow passage being connected to a space between annular sealing members adjacent to each other in the axial direction among the plurality of annular sealing members.

12. The sealing mechanism according to claim 11, comprising a pressure changing device, wherein the pressure changing device performs exhausting and suctioning operation in the flow passage based on a pressure or a gas flow rate of the flow passage.

13. The sealing mechanism according to claim 11, comprising a pressure changing device, wherein the pressure changing device constantly performs exhausting operation in the flow passage.

14. A drive unit of a sealing mechanism comprising:
the sealing mechanism according to claim 1; and
a drive unit applying at least one of rotary movement and linear movement to the shaft.

15. A conveyance device comprising:
the sealing mechanism according to claim 1; and
a movable member moving a conveyance object,
wherein movement of the movable member is linked with at least one of rotary movement and linear movement of the shaft.

16. A manufacturing device comprising the sealing mechanism according to claim 1.

* * * * *